US012610508B2

(12) United States Patent
Nasr Azadani et al.

(10) Patent No.: US 12,610,508 B2
(45) Date of Patent: Apr. 21, 2026

(54) SYSTEMS AND METHODS FOR COOLING DATACENTERS

(71) Applicant: Microsoft Technology Licensing, LLC, Redmond, WA (US)

(72) Inventors: Ehsan Nasr Azadani, Bellevue, WA (US); Eric C. Peterson, Woodinville, WA (US); Winston Allen Saunders, Seattle, WA (US); Sean Patrick Abbott, Redmond, WA (US); Mark Alan Monroe, Louisville, CO (US); Sean Michael James, Olympia, WA (US); Kristofer Andrew Johnson, Snoqualmie, WA (US); Christian L. Belady, Mercer Island, WA (US); Anthony Joseph Bianchi, Urbandale, IA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 372 days.

(21) Appl. No.: 18/206,523

(22) Filed: Jun. 6, 2023

(65) Prior Publication Data

US 2024/0414892 A1 Dec. 12, 2024

(51) Int. Cl.
*H05K 7/20* (2006.01)
*G06N 3/02* (2006.01)

(52) U.S. Cl.
CPC .......... *H05K 7/20836* (2013.01); *G06N 3/02* (2013.01)

(58) Field of Classification Search
CPC ... H05K 7/20836; H05K 7/20827; G06N 3/02
See application file for complete search history.

(56) References Cited

U.S. PATENT DOCUMENTS 9,313,929 B1    4/2016   Malone
11,039,551 B1   6/2021   Bailey
(Continued)

FOREIGN PATENT DOCUMENTS

CN          115942720 A     4/2023
EP          3305047 A1      4/2018
(Continued)

OTHER PUBLICATIONS

"Innovative Cooling Solutions Reduce Datacenter Water Consumption", Retrieved From: https://web.archive.org/web/20220317092727/https://local.microsoft.com/wp-content/uploads/2021/11/Datacenter-water-consumption-fact-sheet.pdf, Mar. 17, 2022, 2 Pages.
(Continued)

*Primary Examiner* — Christopher E. Everett
(74) *Attorney, Agent, or Firm* — Ray Quinney & Nebeker P.C.; John O. Carpenter

(57) ABSTRACT

A system may include a datacenter supervisory control system (SCS). A system may include at least one datacenter sensor in data communication with the SCS to communicate a datacenter state variable to the SCS. A system may include at least one environmental sensor in data communication with the SCS to communicate an environmental state variable to the SCS. A system may include a water aware controller in data communication with the SCS, wherein the water aware controller includes a predictor that receives a datacenter state input based on the datacenter state variable, the environmental state input based on the environmental state variable, and at least one user objective function, and the water aware controller transmits a selected action to the SCS to meet a setpoint based on the datacenter state input and the environmental state input.

20 Claims, 9 Drawing Sheets

(56)                References Cited

U.S. PATENT DOCUMENTS

| | | | |
|---|---|---|---|
| 11,622,468 B1 | 4/2023 | Welsko | |
| 2008/0185446 A1 | 8/2008 | Tozer | |
| 2010/0076607 A1* | 3/2010 | Ahmed | G06F 1/206 |
| | | | 700/297 |
| 2010/0154448 A1* | 6/2010 | Hay | F24F 1/0067 |
| | | | 62/119 |
| 2011/0100045 A1 | 5/2011 | Carlson | |
| 2013/0062047 A1* | 3/2013 | Vaney | H05K 7/20745 |
| | | | 236/44 C |
| 2013/0073245 A1* | 3/2013 | Bhagwat | H05K 7/20836 |
| | | | 702/130 |
| 2013/0163193 A1* | 6/2013 | Ballantine | H05K 7/20745 |
| | | | 361/679.48 |
| 2017/0318705 A1 | 11/2017 | Köster | |
| 2018/0124955 A1 | 5/2018 | Rogers | |
| 2019/0120509 A1 | 4/2019 | Seeley et al. | |
| 2019/0327861 A1 | 10/2019 | Duncan | |
| 2020/0037472 A1 | 1/2020 | Carlson et al. | |
| 2021/0100136 A1 | 4/2021 | Jochim et al. | |
| 2021/0405727 A1* | 12/2021 | Singh | G06F 1/329 |
| 2022/0003437 A1 | 1/2022 | Lepoudre et al. | |
| 2022/0026095 A1* | 1/2022 | Abdel-Salam | F24F 11/65 |
| 2022/0240422 A1 | 7/2022 | Heydari | |
| 2022/0252285 A1 | 8/2022 | Sweeney | |
| 2023/0240054 A1* | 7/2023 | Neuman | H05K 7/20272 |
| 2023/0376093 A1* | 11/2023 | Meganathan | G06F 1/206 |
| 2024/0334657 A1 | 10/2024 | Nasr Azadani | |

FOREIGN PATENT DOCUMENTS

| | | |
|---|---|---|
| EP | 4287799 A1 | 12/2023 |
| JP | 2013047577 A | 3/2013 |
| JP | 2014122774 A | 7/2014 |

OTHER PUBLICATIONS

U.S. Appl. No. 18/126,866, filed Mar. 27, 2023.
Non-Final Office Action mailed on Feb. 5, 2025, in U.S. Appl. No. 18/126,866, 7 pages.
Notice of Allowance mailed on May 28, 2025, in U.S. Appl. No. 18/126,866, 08 pages.
International Search Report and Written Opinion received for PCT Application No. PCT/US2024/021019, Jul. 18, 2024, 13 pages.
Invitation To Pay Additional Fees received for PCT Application No. PCT/US2024/030685, Sep. 17, 2024, 11 pages.
International Search Report and Written Opinion received for PCT Application No. PCT/US2024/030685, Nov. 8, 2024, 18 pages.
International Preliminary Report on Patentability (Chapter I) received for PCT Application No. PCT/US2024/021019, Oct. 9, 2025, 8 pages.

* cited by examiner

PSYCHROMETRIC CHART
Normal Temperature
SI Units
SEA LEVEL
Barometric Pressure: 101.325 kPa PHX 10 Jun TMY3 Evaporative Cooling Zone Dry Bulb Temperature - C°

Humidity Ratio – Grams Moisture per Kilogram Dry Air

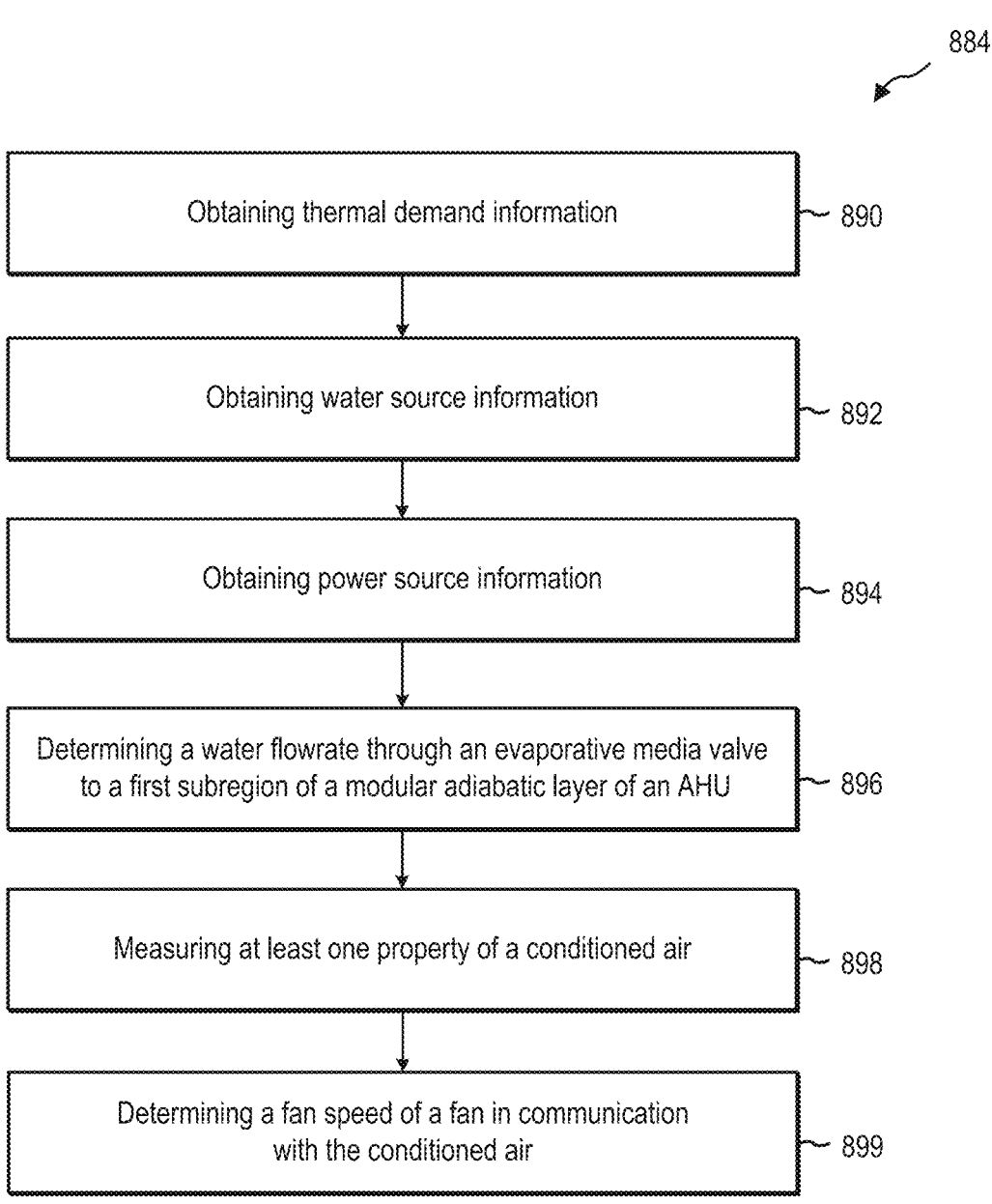

884

Obtaining thermal demand information ~ 890

Obtaining water source information ~ 892

Obtaining power source information ~ 894

Determining a water flowrate through an evaporative media valve to a first subregion of a modular adiabatic layer of an AHU ~ 896

Measuring at least one property of a conditioned air ~ 898

Determining a fan speed of a fan in communication with the conditioned air ~ 899

1323 — Obtaining a datacenter digital twin

1325 — Training a machine learning model of the digital twin

1327 — Predicting a datacenter state prediction

1329 — Selecting a selected action at an action engine

SYSTEMS AND METHODS FOR COOLING DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing demands and applications produce different amounts of thermal energy and require different amounts of thermal management.

BRIEF SUMMARY

In some aspects, the techniques described herein relate to a thermal management system including: a datacenter supervisory control system (SCS); at least one datacenter sensor in data communication with the SCS to communicate a datacenter state variable to the SCS; at least one environmental sensor in data communication with the SCS to communicate an environmental state variable to the SCS; and a water aware controller in data communication with the SCS, wherein the water aware controller includes a predictor that receives a datacenter state input based on the datacenter state variable, the environmental state input based on the environmental state variable, and at least one user objective function, and the water aware controller transmits a selected action to the SCS to meet a setpoint based on the datacenter state input and the environmental state input.

In some aspects, the techniques described herein relate to a method of thermal management in a datacenter, the method including: obtaining a datacenter digital twin; training a machine learning model of the digital twin; predicting a datacenter state prediction using the machine learning model; and selecting a selected action at an action engine based on the datacenter state prediction.

In some aspects, the techniques described herein relate to a thermal management system including: a datacenter supervisory control system (SCS); at least one datacenter sensor in data communication with the SCS to communicate a datacenter state variable to the SCS; at least one environmental sensor in data communication with the SCS to communicate an environmental state variable to the SCS; and a water aware controller in data communication with the SCS, wherein the water aware controller includes: a climate engine configured to determine an environmental prediction, a predictor configured to determine a datacenter state prediction, and an action engine configured to select a selected action based on the environmental prediction, the datacenter state prediction, and at least one objective function.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a front view of a modular adiabatic layer, according to at least one embodiment of the present disclosure;

FIG. 3-2 is a front view of the modular adiabatic layer of FIG. 3-1 with different subregions wetted by evaporative media, according to at least one embodiment of the present disclosure;

FIG. 3-3 is a front view of the modular adiabatic layer of FIG. 3-1 with all subregions wetted, according to at least one embodiment of the present disclosure;

FIG. 8 is a flowchart illustrating a method of thermal management in a datacenter, according to at least one embodiment of the present disclosure;

DETAILED DESCRIPTION

The present disclosure relates generally to systems and methods for thermal management of electronic devices or other heat-generating components. More particularly, the present disclosure relates to thermal management of electronic devices or other heat-generating components in a datacenter using a heating, ventilation, and air conditioning (HVAC) system for the datacenter. In some embodiments, the HVAC system includes at least one air handling unit (AHU) that includes a modular adiabatic layer. The modular adiabatic layer is selectively wet with an evaporative medium in subregions of the modular adiabatic layer. The selective wetting of subregions, in some embodiments, allows more precise control of the adiabatic cooling of air passed through the modular adiabatic layer. The selective wetting of subregions, in some embodiments, allows for correlation with and control of air conditioning in affected zones downstream from the AHU.

Datacenters include a plurality of electronic devices, some of which are computing devices, that all generate thermal energy. The thermal energy needs to be transported away from the electronic devices to prevent damage to the electronic devices and/or protect the integrity of the data stored and/or computed on the electronic devices. Datacenters use thermal management systems to carry thermal energy away from the electronic devices by liquid cooling, air cooling, or a combination thereof. Even in liquid cooled systems, the liquid cooling may efficiently conduct thermal energy from the electronic devices but ultimately reject the thermal energy from the warmed fluid (e.g., liquid or vapor) into the ambient atmosphere. The warmed ambient air must then be moved from the liquid cooling system and/or the electronic devices to complete the thermal management of the electronic devices, which may be inefficient.

In some embodiments of datacenters and thermal management systems according to the present disclosure, a plurality of heat generating devices are located in an enclosed space and air is moved through an AHU to condition the air around the server racks and devices housed therein. While the present disclosure will describe the use of airflow to cool heat-generating devices directly, such as cooling computing devices, hardware storage devices, networking devices, power supplies, and other electronic devices, it should be understood that the thermal management system may use liquid cooling fluid flow to cool heat sinks of heat-generating components.

Figure 1:
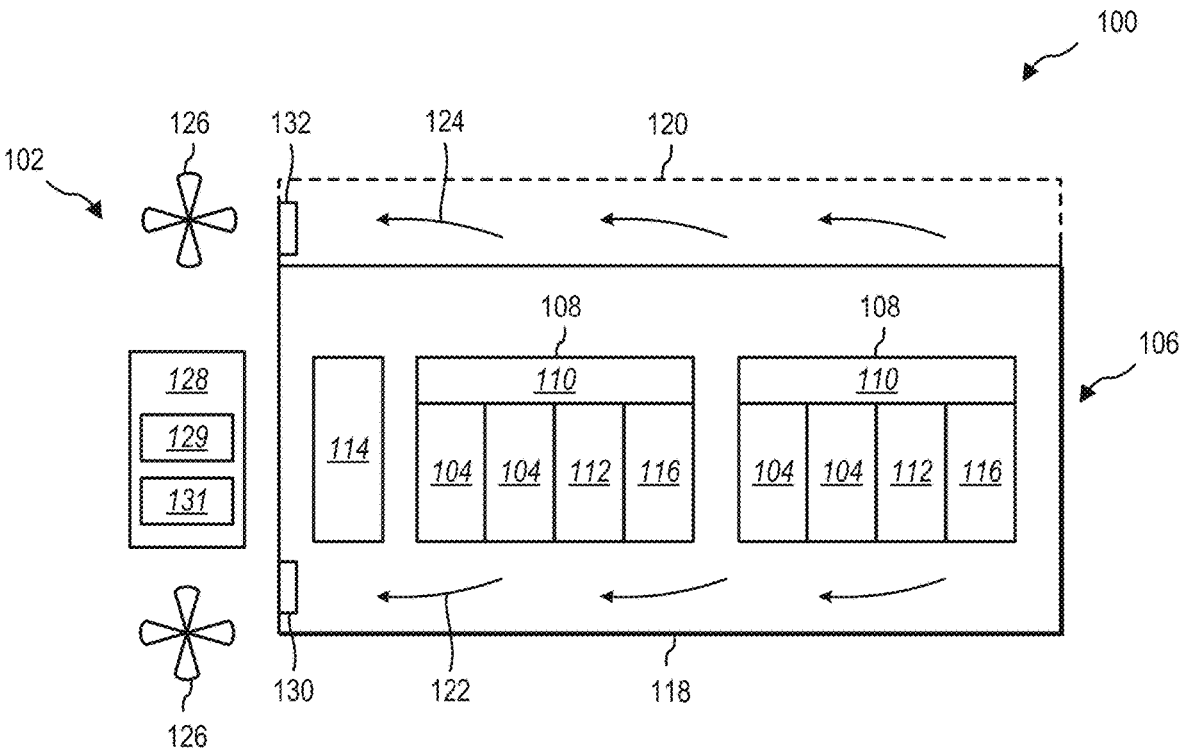
FIG. 1 is a side schematic representation of a datacenter with a thermal management system, according to at least one embodiment of the present disclosure.

FIG. 1 is a schematic representation of a datacenter 100 with a thermal management system 102. An example environment in which thermal management systems and methods according to the present disclosure may be used is a server array. In some embodiments, the datacenter 100 includes server computers 104 arranged in a row 106, where the row contains a plurality of server racks 108, each of which contain a plurality of server computers 104, power supplies 110, networking devices 112, and other electronic devices. In some examples, the server computer 104 is a blade server. In some examples, the server computers are complete computers (e.g., each server computer can function as a standalone computer). In some examples, the server computers 104 are electronic components that can cooperate to provide scalable computational power.

The server row 106 can include a row manager 114 that is in communication with the server racks and/or rack manager 116 of the server row 106. In some embodiments, the row manager 114 controls computational loads, such as process allocations, of the server racks 108 and/or server computers 104. In doing so, the row manager 114 may control the amount of heat generated by the server computers 104 of the server racks 108. In some embodiments, the row manager 114 controls thermal management of the server racks and/or server computers. For example, the row manager 114 can manage active thermal management for the server racks 108 and/or server computers 104 by changing fan speed or by controlling the flow rate of a cooling fluid for liquid cooling systems. In at least one example, the server row 106 is at least partially cooled by a liquid cooling system that delivers cooling fluid to the server racks 108 of the server row 106. The row manager 114 is in communication with the cooling fluid pump to change or stop the flow of cooling fluid.

A server rack 108 can support a plurality of server computers 104 in the rack. The server computers may each have liquid cooling, such as localized immersion cooling, for at least some electronic components of the server computer, or a cooling plate with recirculating cooling fluid to cool the electronic component(s) of the server computer. In some embodiments, the server computers 104 or other electronic devices may be air-cooled, utilizing a cold aisle 118 and a hot aisle 120 that flow colder air 122 from the cold aisle 118 and evacuate hotter air 124 from the electronic devices through the hot aisle 120. The air flows from the cold aisle 118 to the hot aisle 120 based on air pressure differentials established by pumps or blowers 126 of the thermal management system in series with the cold aisle 118 and the hot aisle 120.

In some embodiments, the electronic components, such as server computers 104, of the server rack 108 are connected to a rack manager 116. The rack manager 116 may control power delivery to the server computers 104 or other electronic components. In some embodiments, the rack manager 116 may communicate with the server computers 104 or other electronic components to power cap or throttle the server computers 104 or other electronic components and manage power draw. The rack manager 116, in some embodiments, is also connected to a cooling fluid pump that moves cooling fluid to one or more server computers or other electronic components in the server rack.

In some embodiments, a supervisory control system (SCS) 128 is connected to the row manager 114 and/or rack manager(s) 116 to communicate with the electronic devices and/or is connected to datacenter sensors 130, 132 to measure one or more properties or operating conditions of the thermal management system 102.

The SCS 128 includes a processor 129 and a hardware storage device 131. The processor 129 may receive information from the thermal sensors 130, 132 and communicate with one or more other devices according to instructions stored on the hardware storage device 131 that cause the processor to perform any of the methods described herein. In some embodiments, the devices in communication with the SCS 128 that may receive instructions from the SCS 128 in response to detecting an increase in temperature include a cooling fluid pump, fan, valve, another thermal management device (e.g., blower 126), or combinations thereof. For example, the SCS 128 may adjust the flow of cooling fluid by turning on the cooling fluid pump or by actuating a valve to direct airflow.

The hardware storage device 131 can be any non-transient computer readable medium that may store instructions thereon. The hardware storage device 131 may be any type of solid-state memory; volatile memory, such as static random access memory (SRAM) or dynamic random access memory (DRAM); non-volatile memory, such as read-only memory (ROM) including programmable ROM (PROM), erasable PROM (ERPOM) or EEPROM; magnetic storage media, such as magnetic tape; a platen-based storage device, such as hard disk drives; optical media, such as compact discs (CD), digital video discs (DVD), Blu-ray Discs, or other optical media; removable media such as USB drives; non-removable media such as internal SATA or non-volatile memory express (NVMe) style NAND flash memory; or any other non-transient storage media.

The air 122 is provided to the entire row 106 and/or rack 108 to cool the ambient air around the components of the rack 108. Cooling the entire environment may not be necessary and, in fact, inefficient, when the heat generation by the components of the server computers 104 and other electronic devices is uneven. For example, a central processing unit (CPU) or system memory of the server computer 104 may generate considerably greater heat than a non-volatile storage device. To limit and/or prevent thermal damage to the CPU, however, the entire ambient air is cooled based off of the CPU temperature and load. Localized cooling can efficiently cool the hottest areas and/or components without expending additional energy to cool the entire room in which the row 106 or rack 108 is located.

In some embodiments, a thermal management system according to the present disclosure provides granular control over cooling rates and locations. In some embodiments, a SCS or other control system is in data communication with an AHU (such as an AHU providing conditioned air to the cold aisle 118, or to other locations in the datacenter 100) to efficiency cool the datacenter based on different thermal demands between server computers 104, rows 106, racks 108, or other locations in the datacenter 100. In some embodiments, water in the datacenter can be used or reused to efficiently and selectively maintain target operating temperatures in the datacenter 100.

Figure 2:
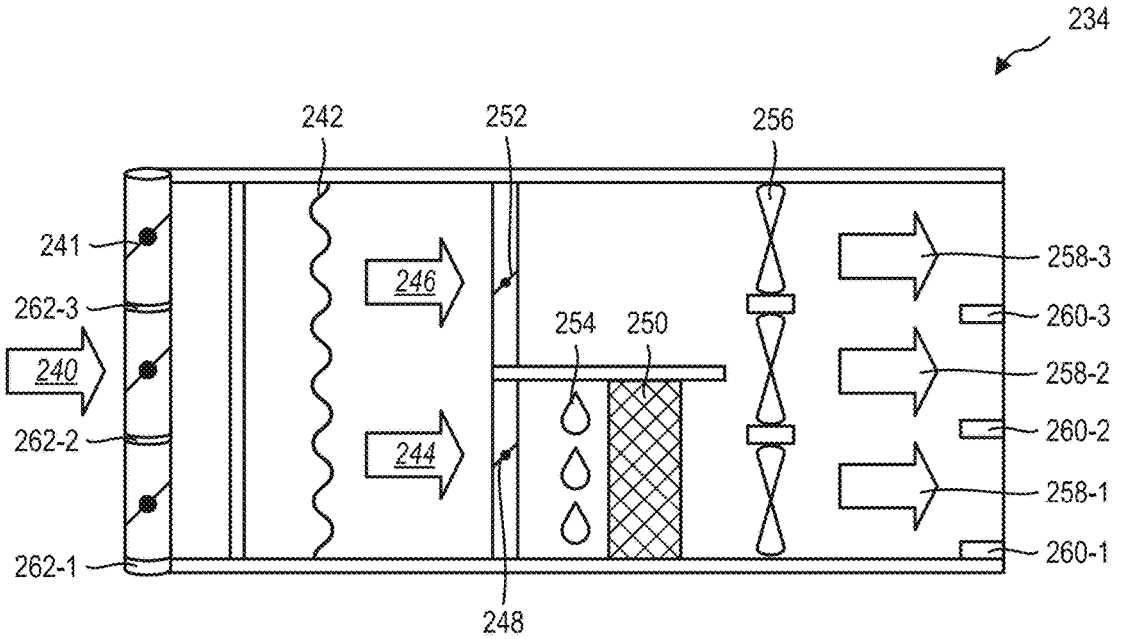
FIG. 2 is a side cross-sectional view of an air handling unit (AHU), according to at least one embodiment of the present disclosure.

FIG. 2 is a schematic representation of an AHU 234 used to condition air for a cold aisle in a datacenter (such as described in relation to FIG. 1). In some embodiments, the AHU 234 intakes outside air (OA) 240 through an intake 241. In some embodiments, the intake 241 includes dampers, valves, or other mechanisms to limit or control airflow through the intake 241. In some embodiments, the intake 241 remains open while the airflow through the AHU 234 is controlled by other dampers, valves, fans, blowers, or other mechanisms in the AHU 234, as will be described.

The AHU 234, in some embodiments, includes a pre-conditioner 242 configured to convectively cool or heat the OA 240 received at the intake 241. For example, the pre-conditioner 242 may include a thermal coil that is maintained at or less than a target temperature below an intake temperature of the OA 240 to cool the OA 240 and create a pre-conditioned air. In another example, the pre-conditioner 242 may include a thermal coil that is maintained at or above a target temperature greater than an intake temperature of the OA 240 to heat the OA 240 and create a pre-conditioned air. In some examples, the pre-conditioner 242 is water-cooled or water-heated. In some examples, the pre-conditioner 242 is heated or cooled through an electrical heater (e.g., a resistive heater) or electric cooler (e.g., a Peltier-style cooler).

In embodiments with a pre-conditioner 242, a first portion 244 of the pre-conditioned air is passed through a chiller damper 248, an adiabatic layer 250, and a second portion 246 of the pre-conditioned air is passed to a bypass damper 252 to bypass the adiabatic layer 250. In embodiments without a pre-conditioner 242, a first portion 244 of the OA 240 is passed through a chiller damper 248, an adiabatic layer 250, and a second portion 246 of the OA 240 is passed to a bypass damper 252 to bypass the adiabatic layer 250. The chiller damper 248 and bypass damper 252, in some embodiments, selectively open and close to direct a selected proportion of air through the bypass and the adiabatic layer 250 to control the temperature and the humidity of the air exhausted after the bypass and the adiabatic layer 250. In some embodiments, an AHU 234 includes only a chiller damper 248 that selectively allows a first portion 244 of the air to pass through the adiabatic layer 250 and a second portion 246 to always pass through the bypass. In some embodiments, an AHU 234 includes only a bypass damper 252 that selectively allows a second portion 246 of the air to pass through the bypass, while a first portion 244 is always allowed to pass through adiabatic layer 250.

The adiabatic layer 250 cools the air passed therethrough by evaporation of evaporative media 254 in the adiabatic layer 250. For example, the adiabatic layer 250 may be wet by water or other evaporative media 254 that, through convective cooling and the evaporation of the evaporative media 254, cool the first portion 244 of the air. In some embodiments, the adiabatic layer 250 also humidifies the first portion 244 of the air. The balance of the first portion 244 and the second portion 246 passed through the adiabatic layer 250 and the bypass, respectively, determines the output humidity and output temperature of the exhausted air.

In some embodiments, the AHU 234 includes one or more fans 256, blowers, or other components to move or urge air through the AHU 234. While the embodiment illustrated in FIG. 2 includes fans 256 located after the adiabatic layer 250, it should be understood that the fans 256, blowers, or other components to move or urge air through the AHU 234 may be located elsewhere in the AHU 234 in addition to or alternative to the fans 256 located after the adiabatic layer 250.

The AHU 234 produces conditioned air to the cold aisle or other portions of the datacenter. In some embodiments, the AHU 234 produces a plurality of columns 258-1, 258-2, 258-3 of conditioned air that are exhausted from the AHU 234 and flow to different regions of the cold aisle or other portion of the datacenter. In some embodiments, the different columns 258-1, 258-2, 258-3 of conditioned air have different properties (e.g., temperature, humidity, density, velocity, turbidity) that affect the direction and/or thermal management capacity (e.g., cooling capacity, heating capacity, humidifying capacity) of the column of conditioned air.

For example, the first column 258-1 of conditioned air is located in a lower portion of the AHU 234 in series after the adiabatic layer 250, and the third column 258-3 of conditioned air is located in an upper portion of the AHU 234 in series after the bypass of the AHU 234. The first column 258-1 and third column 258-3 may have different properties, such as different temperature, different humidity, and different density.

In some embodiments, the AHU 234 includes one or more conditioned air sensors 260-1, 260-2, 260-3 configured to measure one or more properties of the conditioned air exhausted from the AHU 234. In embodiments including one or more intake sensors 262-1, 262-2, 262-3, the AHU 234 may measure and/or calculate a change in properties of the air through the AHU 234 (from the OA 240 to the columns 258-1, 258-2, 258-3 of conditioned air). The AHU 234 can report the properties and/or changes in properties measured by the sensor(s) to the SCS (such as the SCS 128 described in relation to FIG. 1).

In some embodiments, at least part of the first portion 244 of the air (passed through the adiabatic layer 250) and the second portion 246 of the air (passed through the bypass) mix between the first column 258-1 and the third column 258-3 in a second column 258-2. The second column 258-2 containing mixed air can have properties different from either the first column 258-1 or the third column 258-3. In some embodiments, the different columns or portions of the conditioned air may exhaust to different locations or components of the datacenter based on the properties of the conditioned air. In some embodiments, the different columns or portions of the conditioned air may exhaust to different locations or components of the datacenter based on the HVAC ducts of the thermal management system of the datacenter. Understanding the localization of the exhausted conditioned air and the properties thereof can allow an SCS in communication with the AHU to provide conditioned air with desired properties to the associated portions of the datacenter.

In some embodiments, differences in the evaporative media 254 or the location of the evaporative media 254 on the adiabatic layer 250 creates variations in the conditioned air exhausted from the AHU 234. For example, the distribution of evaporative media 254 on the adiabatic layer 250 can create variations in the first column 258-1 of conditioned air. Understanding and controlling the variations in the conditioned air, and understanding and controlling where the conditioned air moves in the datacenter, can allow more precise control of the air in the datacenter for thermal management.

Figures 1, 3:
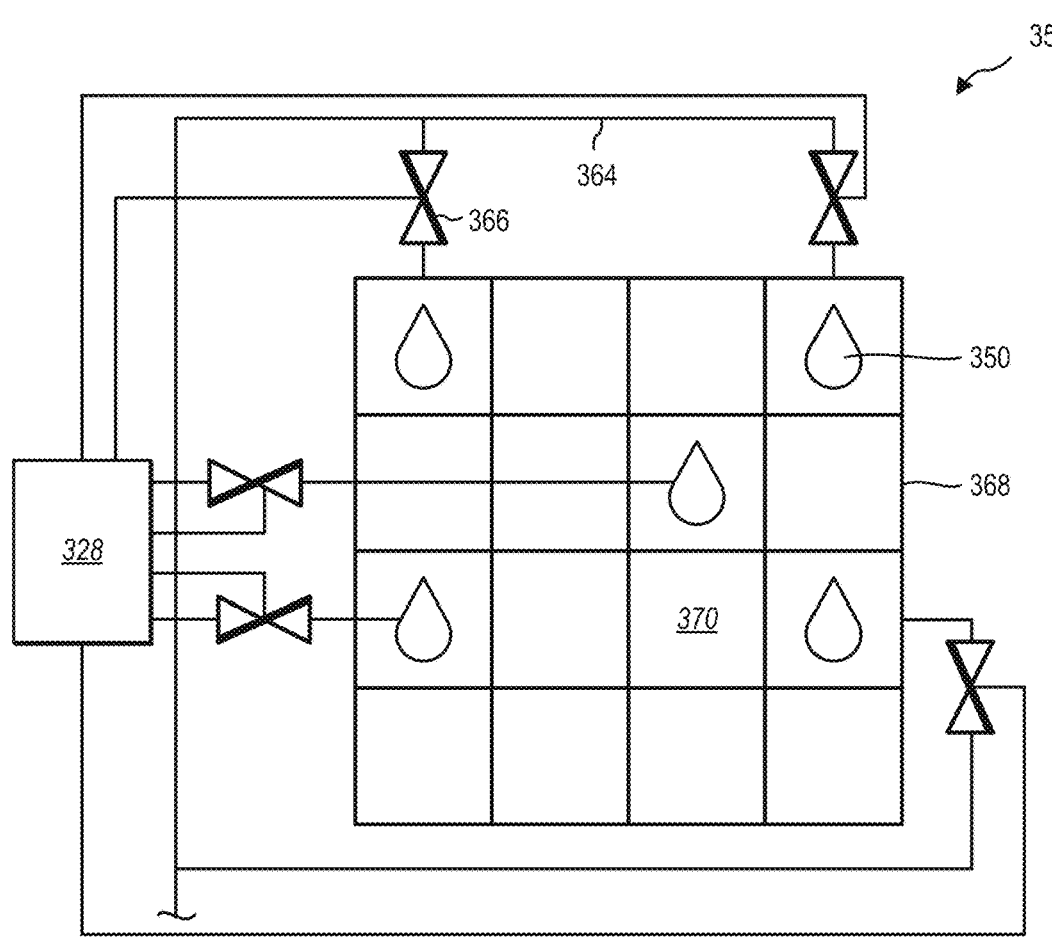
Figures 2, 3:
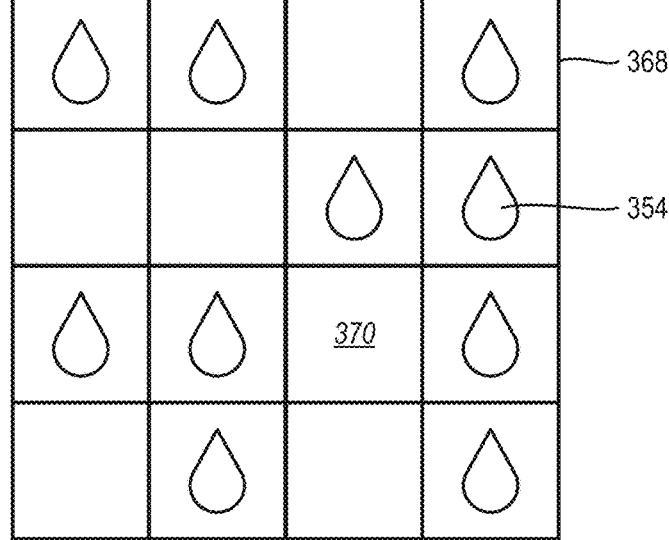
Figure 3:
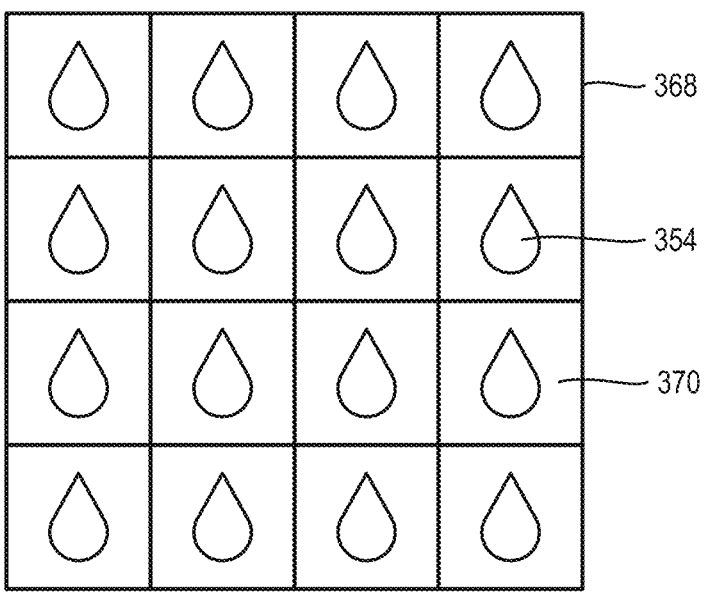

Referring now to FIG. 3-1 through FIG. 3-3, in some embodiments, an AHU includes a modular adiabatic layer 350. For example, a modular adiabatic layer 350 may be used with the AHU 234 described in relation to FIG. 2. In some embodiments, a modular adiabatic layer 350 includes a plurality of evaporative media conduits 364 and evaporative media valves 366 configured to direct and/or supply evaporative media 354 to an evaporative substrate 368 of the modular adiabatic layer 350. The evaporative media valves 366 are positioned inline with the evaporative media conduits 364 to selectively allow, control, or prevent flow of evaporative media 354 to the evaporative substrate. In some embodiments, the plurality of evaporative media conduits 364 allow delivery of evaporative media 354 to a plurality of subregions 370 of the evaporative substrate 368.

In some embodiments, an SCS 328 is in data communication or electrical communication with the evaporative media valves 366 to control a flowrate of the evaporative media 354 through the evaporative media valves 366 and to the subregions 370. By controlling the flow to the subregions 370, the SCS 328 can control the amount and location of cooling and humidifying of the air passed through the modular adiabatic layer 350. In some embodiments, the SCS 328 is further in communication with datacenter sensors (such as datacenter sensors 130, 132 described in relation to FIG. 1), AHU sensors (such as conditioned air sensors 260-1, 260-2, 260-3 and/or intake sensors 262-1, 262-2, 262-3 described in relation to FIG. 2), external environmental sensors that measure and/or report environmental information outside of the datacenter (from where the OA is drawn), other sensors, and combinations thereof. In some embodiments, the SCS 328 determines how much evaporative media 354 to provide to the evaporative substrate 368 and to which subregions 370.

For example, FIG. 3-1 illustrates an example of a modular adiabatic layer 350 with evaporative media 354 wetting five subregions 370 of the evaporative substrate 370. Air passing through the evaporative substrate 370 of the modular adiabatic layer 350 may be cooled more in the locations of the subregions 370 wetted by the evaporative media 354. FIG. 3-2 illustrates an example of the evaporative substrate 368 of FIG. 3-1 with a greater quantity of subregions 370 wetted by the evaporative media 354. For example, as an environmental sensor or an intake sensor in communication with the SCS indicates that a temperature of the OA entering the AHU increases, the SCS may instruct or control the evaporative media valves to provide more evaporative media to the evaporative substrate 368 and/or to more subregions 370 of the evaporative substrate 368. In another example, a datacenter sensor or conditioned air sensor in communication with the SCS indicates that a humidity of the OA exhausted from the AHU is greater than desired, and the SCS may instruct or control one or more evaporative media valves to provide less evaporative media to the evaporative substrate 368 and/or to less subregions 370 of the evaporative substrate 368. In some embodiments, further increases in cooling and/or humidification are needed, and FIG. 3-3 illustrates an example of an evaporative substrate 368 with all subregions 370 wetted by an evaporative media 354. In some embodiments, all subregions 370 are wetted, and the SCS can further control the amount of cooling and/or humidification by the quantity of evaporative media 354 delivered to each subregion 370.

In some embodiments, the material of the evaporative substrate 368 provides different properties based at least partially on the material. For example, wicking rates, fluid retention rates, surface area, drying rates, flowrates of air therethrough, etc., may vary based on the porosity, density, and construction of the substrate material. In some embodiments, the evaporative substrate 368 includes different substrate materials in different subregions 370 such that wetting the different subregions 370 of the evaporative substrate 368 wets different substrate materials with different properties.

In some embodiments, at least a portion of the evaporative substrate includes a cellulose-based substrate material. For example, the substrate material may be or include paper, shredded paper, cellulose pulp, or other cellulose-based substrate materials. In some embodiments, the substrate material includes an organic textile. For example, the substrate material may be or include wool, silk, cotton, etc. In some embodiments, the substrate material includes a synthetic textile. For example, the substrate material may be or include polypropylene, nylon, aramid fibers, etc. In some embodiments, the substrate material includes ceramic materials. For example, the substrate material may be or include ceramic plates, fins, pins, rods, cylinders, meshes, etc. In some embodiments, the substrate material includes a metal. For example, the substrate material may be or include a metal plate, pin, fin, mesh, grid, rod, foam, etc.

In some embodiments, the substrate material is microporous. For example, a microporous substrate material has a porosity less than 1000 micrometers. In some embodiments, the substrate material is nanoporous. For example, a nanoporous substrate material has a porosity less than 1.0 micrometer. In some embodiments, the substrate material is nonporous. For example, a nonporous substrate material has a porosity substantially equal to zero.

Figure 4:
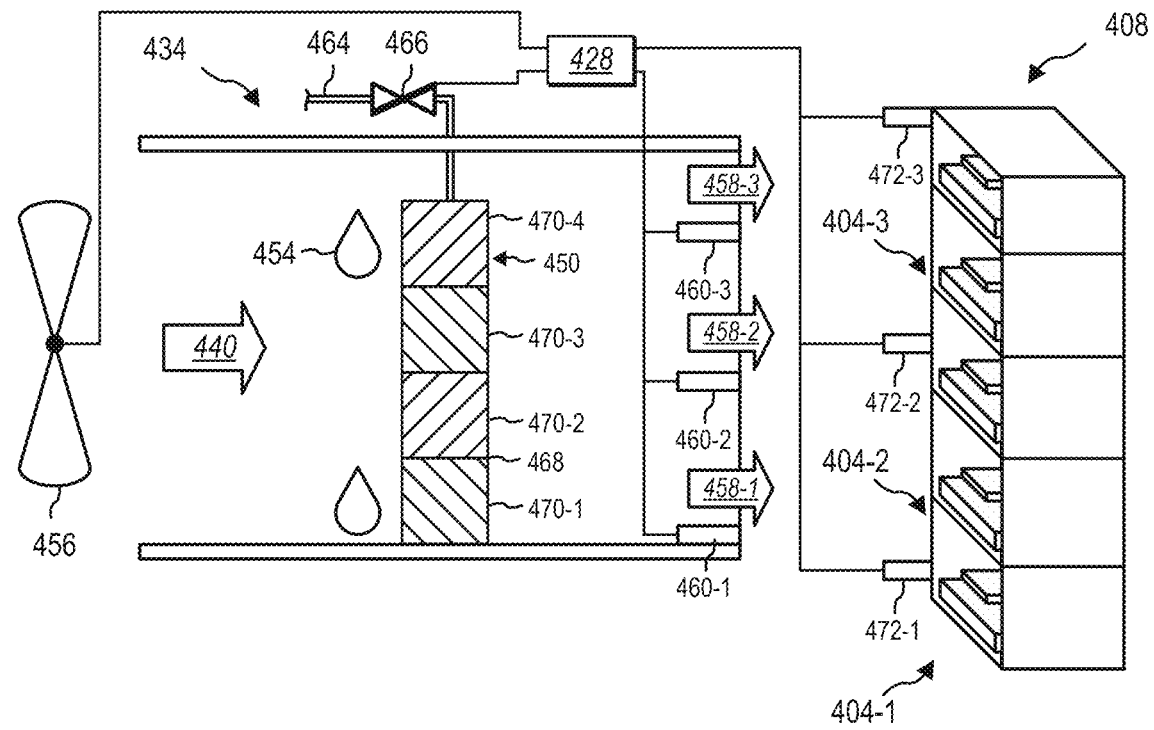
FIG. 4 is a side view of an AHU providing conditioned air to a server rack, according to at least one embodiment of the present disclosure.

FIG. 4 is a schematic representation of an embodiment of an AHU 434 in communication with an SCS 428 to direct conditioned air for cooling at certain server computers 404-1, 404-2, 404-3 in a rack. In some embodiments, the AHU 434 includes a modular adiabatic layer 450 with a plurality of subregions 470-1, 470-2, 470-3, 470-4 of the evaporative substrate 468. The SCS 428 controls one or more evaporative media valves 466. The evaporative media valves 466 control a flowrate of evaporative media 454 through the evaporative media conduit(s) 464 that provide the evaporative media to the subregions 470-1, 470-2, 470-3, 470-4.

In some embodiments, the SCS 428 is in communication with a plurality of sensors, such as conditioned air sensors 460-1, 460-2, 460-3 or rack sensors 472-1, 472-2, 472-3. In some embodiments, the rack sensors 472-1, 472-2, 472-3 are component sensors that measure and/or report operating conditions of an electronic component or air conditions at the electronic component. For example, the rack sensors 472-1, 472-2, 472-3 may be component temperature sensor, a component humidity sensor, or a component barometer. The SCS 428 can receive information measured by the sensors in response to changes bade to the AHU 434 by the SCS 428. In some examples, the SCS 428 is in communication with a fan 456 configured to intake OA 440 and direct airflow at the modular adiabatic layer 450. The air passes through the modular adiabatic layer 450 and is exhausted from the AHU 434 as conditioned air.

In some embodiments, such as that illustrated in FIG. 4, different portions of the conditioned air flow toward different areas of the datacenter and devices therein. For example, a first column 458-1 of conditioned air flows toward a first server computer 404-1 of a server rack 408. A first conditioned air sensor 460-1 in or adjacent to the first column 458-1 of conditioned air provides information to the SCS 428 regarding air properties of the first column 458-1 of conditioned air exhausted from the AHU 434. In some embodiments, a second conditioned air sensor 460-2 in or adjacent the second column 458-2 of conditioned air provides information to the SCS 428 regarding air properties of the second column 458-2 of conditioned air exhausted from the AHU 434. In some embodiments, a third conditioned air sensor 460-3 in or adjacent the third column 458-3 of conditioned air provides information to the SCS 428 regarding air properties of the third column 458-3 of conditioned air exhausted from the AHU 434.

In some embodiments, the first column 458-1 of conditioned air (near the bottom of the modular adiabatic layer 450 and/or the bottom of the AHU 434) flows toward a first server computer 404-1 of a server rack 408, and a first rack air sensor 472-1 located at or near the bottom of the server rack 408 provides information to the SCS 428 regarding air properties at the first server computer 404-1 of the server rack 408. In some embodiments, the second column 458-2 of conditioned air (near the middle of the modular adiabatic layer 450 and/or the middle of the AHU 434) flows toward a second server computer 404-2 of a server rack 408, and a second rack air sensor 472-2 located at or near the middle of the server rack 408 provides information to the SCS 428 regarding air properties at the second server computer 404-2 of the server rack 408. In some embodiments, the third column 458-3 of conditioned air (near the top of the modular adiabatic layer 450 and/or the top of the AHU 434) flows toward a third server computer 404-3 of a server rack 408, and a third rack air sensor 472-3 located at or near the top of the server rack 408 provides information to the SCS 428 regarding air properties at the third server computer 404-3 of the server rack 408.

In some embodiments, the SCS 428, by monitoring changes in the air properties measured by the AHU sensors (e.g., conditioned air sensors 460-1, 460-2, 460-3) and datacenter sensors (e.g., rack sensors 472-1, 472-2, 472-3), can determine how changes to the AHU 434 operations affect the air properties in different affected zones of the datacenter. For example, the third server computer 404-3 at or near the top of the server rack 408 may require more thermal management capacity (e.g., cooling) because the air is warmer near the top of the server rack 408, as measured by the third rack sensor 472-3. In some examples, wetting the fourth subregion 470-4 of the modular adiabatic layer 450 cools the third column 458-3 of conditioned air more than the first column 458-1 or second column 458-2, and the third column 458-3 of conditioned air (near the top of the modular adiabatic layer 450 and/or the top of the AHU 434) is determined to have a greater effect on the third server computer 404-3 at the top of the server rack 408. By correlating a wetting pattern or other operating condition of the modular adiabatic layer 450 and/or the AHU 434 to the information provided by the third rack sensor 472-3 proximate the third server computer 404-3, the SCS can determine that the area (and devices) near the third rack sensor 472-3 is an affected zone of the fourth subregion 470-4 and/or third column 458-3 of the AHU 434.

An affected zone is an area, volume, region, or location in the datacenter for which the air measured to be affected by changes to the operating conditions of the AHU 434. For example, an affected zone may be affected by changes to wetting of different subregions 470-1, 470-2, 470-3, 470-4 of the modular adiabatic layer 450, the amount of evaporative media 454 applied to the evaporative substrate, the AHU fan speed (e.g., of the fan 456), or other operating conditions of the AHU 434. In at least one example, the AHU 434 includes a fan 456 located before the modular adiabatic layer 450 in the direction of the airflow therethrough and a fan located after the modular adiabatic layer 450 in the direction of the airflow (such as fans 256 in FIG. 2). A fan, blower, or other mechanism for moving the air through the AHU may mix air exposed to the fan. Therefore, the correlated effect of the AHU to the affected zone may change depending on the fan speed and also the relative location of the fan in the AHU 434. The SCS may change the fan speed or a selected operating fan to adjust the effect on the affected zone.

In some embodiments, an affected zone may be measured by devices, such as server computers in a rack. In such examples, the SCS may measure or receive a thermal demand request from a device or sensor associated with the affected zone, and the SCS may change at least one operating condition of the AHU to change the thermal management supplied to the affected zone.

In some embodiments, an affected zone may be measured by rack, such as individual server racks in a row. In such examples, the SCS may measure or receive a thermal demand request from a rack manager, row manager, or sensor associated with the affected zone, and the SCS may change at least one operating condition of the AHU to change the thermal management supplied to the affected zone.

Figure 5:
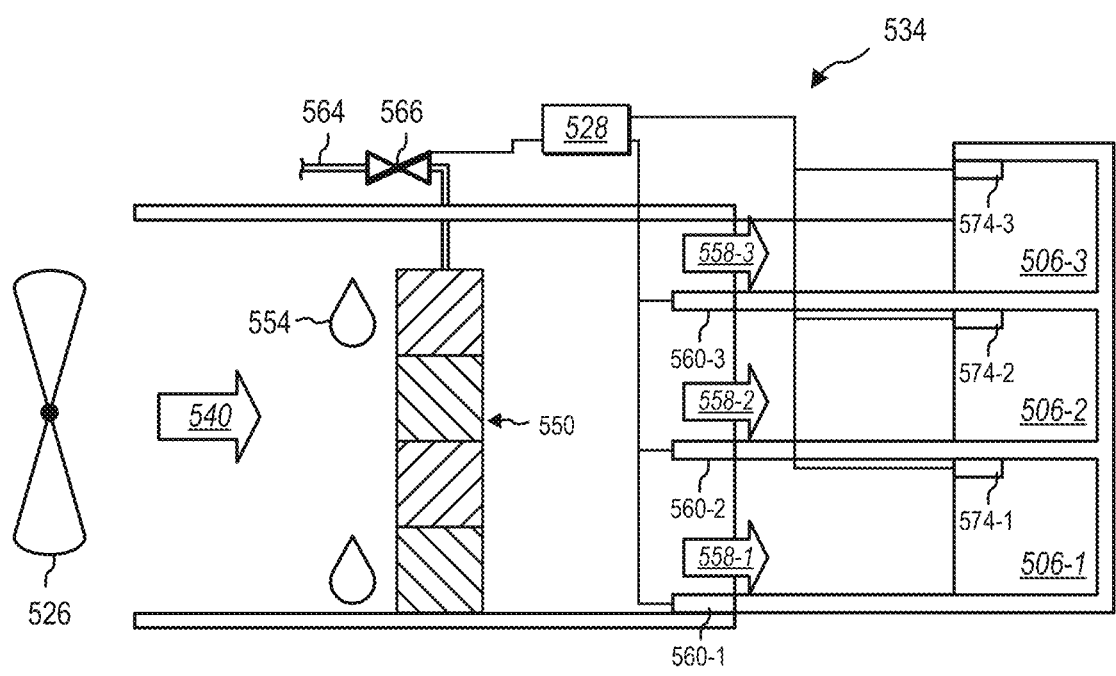
FIG. 5 is a side view of an AHU providing conditioned air to server rows, according to at least one embodiment of the present disclosure.

FIG. 5 is a schematic representation of an SCS 528 in communication with an AHU 534 and datacenter sensors associated with rooms containing different server rows 506-1, 506-2, 506-3. In some embodiments, an affected zone may be measured by row, such as individual server rows 506-1, 506-2, 506-3. In such examples, the SCS 528 may measure or receive a thermal demand request from row manager or datacenter sensor associated with the affected zone, and the SCS 528 may change at least one operating condition of the AHU 534 to change the thermal management supplied to the affected zone.

In some embodiments, the first column 558-1 of conditioned air (near the bottom of the modular adiabatic layer 550 and/or the bottom of the AHU 534) flows toward a first server room containing a first server row 506-1, and a first datacenter air sensor 574-1 located at or near the first server row 506-1 provides information to the SCS 528 regarding air properties at the first server row 506-1. In some embodiments, the second column 558-2 of conditioned air (near the middle of the modular adiabatic layer 550 and/or the middle of the AHU 534) flows toward a second server room containing a second server row 506-2, and a second datacenter air sensor 574-2 located at or near the second server row 506-2 provides information to the SCS 528 regarding air properties at the second server row 506-2. In some embodiments, the third column 558-3 of conditioned air (near the top of the modular adiabatic layer 550 and/or the top of the AHU 534) flows toward a third server room containing a third server row 506-3, and a third datacenter air sensor 574-3 located at or near the third server row 506-3 provides information to the SCS 528 regarding air properties at the third server row 506-3.

In some embodiments, the SCS 528, by monitoring changes in the air properties measured by the AHU sensors (e.g., conditioned air sensors 560-1, 560-2, 560-3) and datacenter sensors (e.g., datacenter air sensors 574-1, 574-2, 574-3), can determine how changes to the AHU 534 operations affect the air properties in different affected zones of the datacenter. For example, the third server row 506-3 may require more thermal management capacity (e.g., cooling) because the server room containing the third server row 506-3 is located on a Southern side of the datacenter and exposed to more sunlight than a first server room located on a Northern side of the datacenter. As will be described in more detail herein, the SCS 528 may correlate thermal demand of affected zones to weather, time, or other repeating conditions to predict thermal demand and prepare for the thermal demands in advance.

In some embodiments, a thermal demand request is any measurement, report, communication, or information that is received, calculated, or obtained by the SCS in relation to current or future temperature of the datacenter or region of the datacenter. For example, a thermal demand request may be received from a device in the datacenter. A device may include a temperature sensor, and the device may transmit a thermal demand request based at least partially on the temperature of or at the device. In some examples, the device may transmit the thermal demand request based at least partially on a power draw of the device, which indicates an increase in thermal energy produced by the device. In some examples, the device may transmit the thermal demand request based at least partially on a computational load of the device, which indicates an increase in thermal energy produced by the device. In some embodiments, the thermal demand request is received from a rack manager, a row manager, a control system, such as virtual machine (VM) allocator, or other control device that transmits the thermal demand request based at least partially on a thermal energy production of a device of the datacenter.

In some embodiments, the thermal demand request is obtained by the SCS from a network connection or from another control service of the datacenter, such as a VM allocator. For example, the SCS may request information from the VM allocator or other control service of the datacenter without waiting to receive the thermal demand request. In some embodiments, the SCS obtains the thermal demand request based at least partially on a measurement of one or more datacenter sensors that measure temperature, humidity, power draw, liquid cooling demands, etc. In at least one example, an increase in demand for liquid cooling or immersion cooling working fluid may indicate an increase in the thermal energy being exhausted into the datacenter air and may indicate an impending thermal demand request.

In other examples, the SCS may obtain environmental information from one or more environmental sensors (such as external temperature sensors, humidity sensors, barometers, etc.) and/or network-based environmental information sources, such as weather reports. The weather reports may allow the SCS to determine a temperature or humidity of outside air that is brought into the datacenter. In some embodiments, the environmental information and/or weather reports may indicate future environmental conditions and/or weather conditions for which the SCS can prepare the datacenter.

In yet other examples, the SCS may obtain a thermal demand request based on a report or determination calculated by the SCS. For example, the SCS may calculate a thermal demand need for one or more affected zones of the datacenter based on past trends indicating increased computational demands during adverse weather conditions. In at least one example, more users may request datacenter services when the weather includes precipitation or high winds and users are more likely to be indoors.

In some embodiments, thermal demand may be related to computational conditions of the datacenter. A thermal demand request or need may be calculated by on a processing load, power draw, bandwidth consumption, VM allocations, or process allocations of devices or racks in the datacenter. Such information may be reported to the SCS by devices, rack managers, row managers, or other control services.

Figure 6:
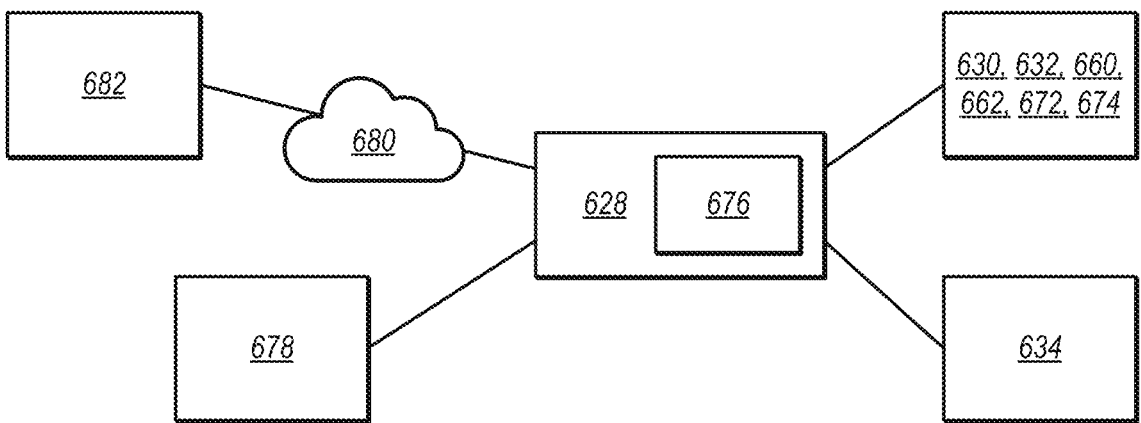
FIG. 6 is a system diagram of a supervisory control system (SCS) in communication with components of a datacenter, according to at least one embodiment of the present disclosure.

FIG. 6 is a system diagram of an SCS 628 in communication with a plurality of components, devices, and services. In some embodiments, the SCS 628 is a in data communication with a plurality of sensors in the datacenter and the HVAC system. For example, the SCS 628 may be in data communication with cold aisle sensors 630 and/or hot aisle sensors 632 of the HVAC system, conditioned air sensors 660 and/or intake sensors 662 of an AHU, rack sensors 672, datacenter sensors 674, and other sensors, such as temperature sensors on the server computers or other devices throughout the datacenter. The plurality of sensors provide information to the SCS 628.

In some embodiments, the SCS 628 is further in data communication with a control service 678 such as an allocator service that allocates processes and/or VM to devices in the datacenter. The control service 678 may communicate to the SCS 628 the processing loads, processing allocations, power draws, schedules, and other operating metrics of the devices of the datacenter. For example, the SCS 628 may be able to proactively adjust the thermal management of the datacenter in response to scheduled computational loads provided by the control service 678.

In some embodiments, the SCS 628 is in data communication with a network 680 through which the SCS 628 can obtain additional information relevant to the operations and thermal management of the datacenter from one or more networked services 682. In at least one example, the networked services include the local or regional weather forecast, which may not be available from the local sensors of the datacenter. In other examples, the networked services may include local pricing, availability, or demand for utility grid electricity and/or municipal water. In some embodiments, the SCS 628 may determine a quantity or wetting pattern of water applied to a modular adiabatic layer of the AHU 634 based at least partially on the local pricing, availability, or demand for utility grid electricity and/or municipal water. For example, when utility grid electricity pricing is high, the SCS 628 may rely more on adiabatic cooling of air in the AHU, and when water availability is limited, the SCS 628 may rely more on airflow through the HVAC system by increasing a fan speed of the AHU or other fans in the HVAC system.

The inputs from the sensors, the control services 678, networked services 682, and other sources are, in some embodiments, provided to an SCS engine 676 that calculates and/or determines operational setting and conditions for an AHU 634. As described herein, the SCS engine 676 may make such determinations based at least partially on Constraints and Objective functions provided to the SCS engine 676.

In some embodiments, the objective functions relate one or more inputs to control variables of the AHU 634 or other portions of the datacenter. For example, the control variables include, but are not limited to, OA temperature, OA relative humidity, modular adiabatic layer state, quantity of available AHU, water pump speed, AHU fan speed, bypass damper position, etc. Based at least partially on the state variables with values measured by the sensors, the SCS engine 676 may determine values for at least some of the control variables.

Figure 7:
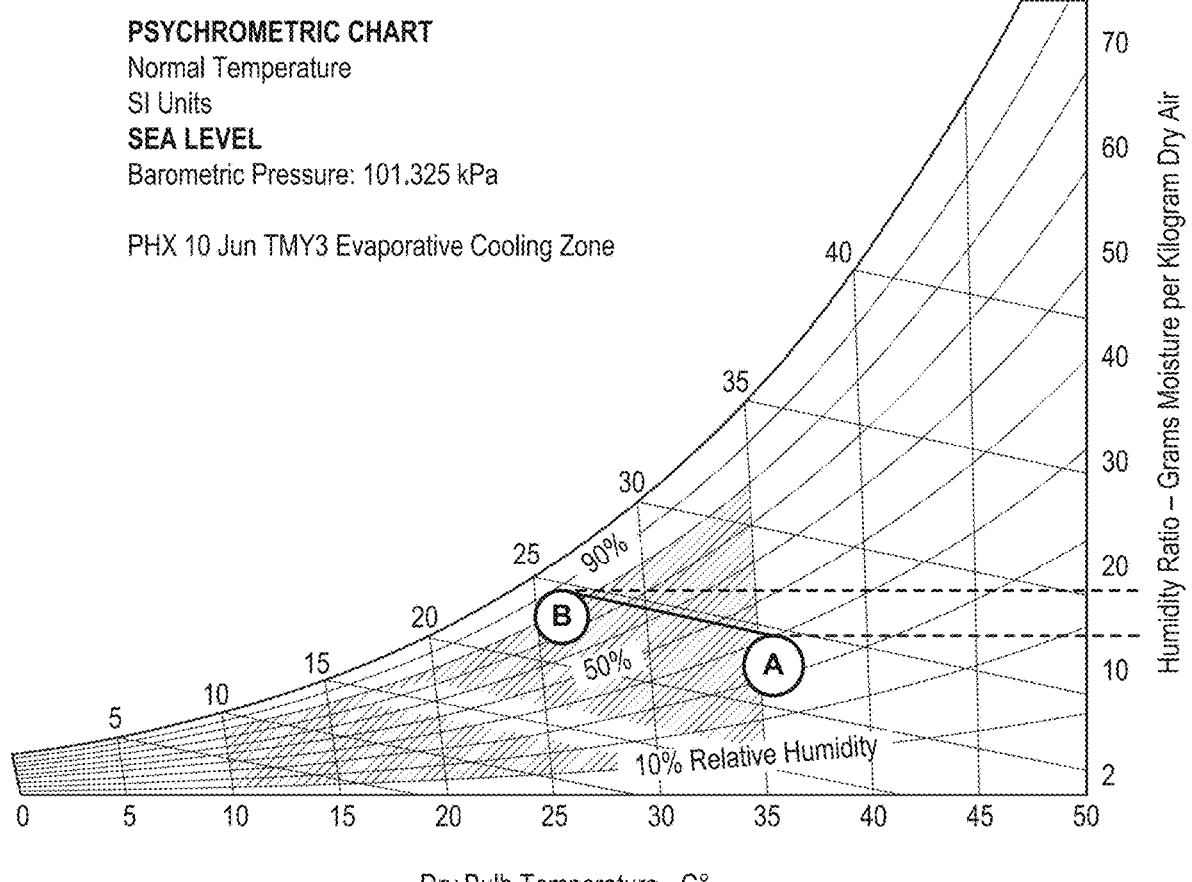
FIG. 7 is a psychrometric chart, according to at least one embodiment of the present disclosure.

In some embodiments, at least some of the control variables are determined based on a psychrometric chart, such as presented in FIG. 7. The psychrometric chart illustrates the change in relative humidity based on temperature. The x-axis is the dry-bulb temperature, which is the temperature indicated by a thermometer exposed to the air in a place sheltered from direct solar radiation. The dry bulb temperature measures the temperature of the air. The relative humidity curve is the ratio of the mole fraction of water vapor to the mole fraction of saturated moist air at the same temperature and pressure. For example, the y-axis reflects the humidity ratio, and is the proportion of mass to water vapor per unit mass of dry air. The relative humidity illustrates the percentage of the humidity ratio for a given temperature and pressure for the air. As the dry bulb temperature decreases during the cooling process, the relative humidity for a given quantity of water in the air increases, allowing additional water to be introduced to the air as humidity ratio.

In some embodiments, the SCS determines how much water to introduce to the modular adiabatic layer and/or a fan speed of the AHU based at least partially on a setpoint for relative humidity. Exceeding a dewpoint in the datacenter may cause condensation, and therefore, the SCS may determine values for control variables to avoid condensation. In at least some embodiments, a psychrometric evaluation of the relative humidity and/or dry bulb temperature can allow the SCS to determine a fan speed and/or flowrate for the AHU to produce a target cooling in an affected zone without causing condensation in the affected zone.

FIG. 8 is a flowchart illustrating a method of thermal management in a datacenter. In some embodiments, the method 884 includes obtaining thermal demand information (e.g., a thermal demand request) at 890, obtaining water source information at 892, and obtaining power source information at 894.

In some embodiments, the method 884 includes, at the SCS and based at least partially on the thermal demand information, the water source information, and the power source information, determining a water flowrate through an evaporative media valve to a first subregion of a modular adiabatic layer of an AHU, such as described herein, at 896. The SCS adjusts the evaporative media valve and/or instructs the evaporative media valve to provide the water flowrate to the first subregion of the modular adiabatic layer. Air that flows through the modular adiabatic layer is conditioned by the convective cooling and humidification of the water (or other evaporative media).

In some embodiments, the method 884 includes measuring at least one property of the conditioned air at 898. In some embodiments, the measured property of the conditioned air is compared to at least one property of an intake air before conditioning. The SCS may make further adjustments to the flowrate of the water or other evaporative media based at least partially on the measured value of the property.

The method 884, in some embodiments, further includes determining a fan speed of a fan in communication with the conditioned air at 899. The SCS may then set the fan speed or instruct the fan to set the fan speed to the determined fan speed. In some embodiments, the fan speed is determined based at least partially on the flowrate of the water. For example, the airflow through the modular adiabatic layer may evaporate a portion of the water or other evaporative media at substantially an equal rate to the flowrate of water or other evaporative media to the evaporative substrate of the modular adiabatic layer.

In some embodiments, the fan is upstream of the modular adiabatic layer. For example, the fan may be before the modular adiabatic layer in the direction of the airflow. In some embodiments, the fan is downstream of the modular adiabatic layer. For example, the fan may be after the modular adiabatic layer in the direction of the airflow. The conditioned air passed through different subregions of the evaporative substrate may mix by different amounts based at least partially on the relative location of the fan to the evaporative substrate. In at least one embodiment, the fan is in the AHU.

The method 884, in some embodiments, further includes determining an affected zone affected by the first subregion. For example, the flowrate of water or other evaporative media to the first subregion and/or fan speed may be determined based at least partially on a measured or calculated relationship between the AHU operating conditions and sensor information provided from a sensor located at an affected zone.

Figure 9:
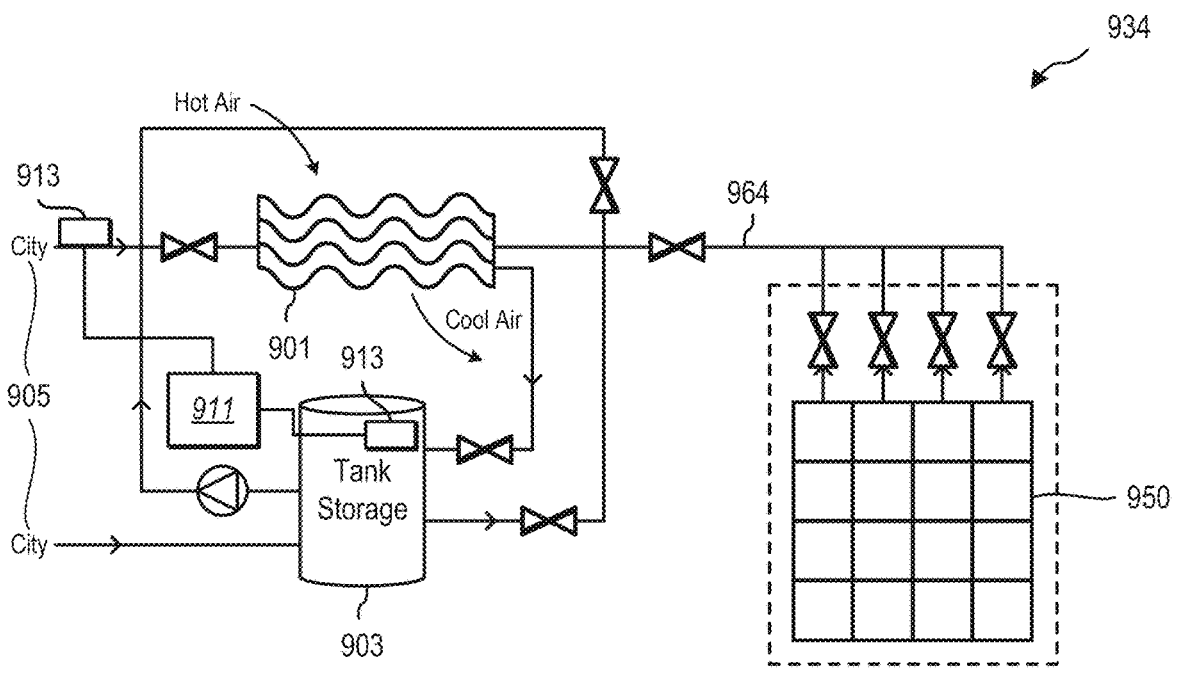
FIG. 9 is a schematic representation of a thermal management system with a water storage tank, according to at least one embodiment of the present disclosure.

FIG. 9 is a schematic representation of a pre-cooling chiller 901 in fluid communication with a water storage tank 903, according to some embodiments of the present disclosure. In some embodiments, the pre-cooling chiller 901 is part of the AHU 934, such as described in relation to the pre-conditioner 242 of FIG. 2. In some embodiments, the pre-cooling chiller 901 is separate from and/or positioned before the AHU 934 containing the modular adiabatic layer 950. The water storage tank 903 and/or the pre-cooling chiller 901 are configured to receive water from a municipal water supply 905. When the municipal water supply 905 has available water, the pre-cooling chiller 901 may receive water directly from the municipal water supply 905. In some embodiments, the pre-cooling chiller 901 receives water from the water storage tank 903.

In at least one embodiment, the water in the water storage tank 903 is recycled water that is recaptured after cycling through the pre-cooling chiller 901. For example, the water is received from the municipal water supply 905 and directed into the pre-cooling chiller 901 where the water cools the OA before a first portion of the water is directed through an evaporative media conduit 964 to the modular adiabatic layer 950 to further condition the air. In some embodiments, at least a second portion of the water is recycled to the water storage tank 903. The water in the water storage tank 903 may be directed for additional cycles through the pre-cooling chiller 901 and/or directed to the modular adiabatic layer 950 through the evaporative media conduit 964.

In some embodiments, a tank controller 911 is in communication with one or more water sensors 913 to measure inlet and outlet temperatures of the water entering and exiting the pre-cooling chiller 901. In some embodiments, the tank controller 911 alters a state of one or more valves to direct water flow from the water storage tank 903 and/or the municipal water supply to adjust and inlet temperature of the water entering the pre-cooling chiller 901. For example, the water stored in the water storage tank 903 may be of a higher temperature than the water of the municipal water supply 905, and the tank controller 911 may adjust a ratio of the municipal water and the tank water entering the pre-cooling chiller 901 to adjust the inlet temperature.

In some embodiments, the AHU 934 is in data communication with the tank controller 911 and/or the water sensors 913. For example, an SCS or another controller of the AHU 934 may communicate with the tank controller 911 and/or the water sensors 913 to measure a water temperature of the pre-cooling chiller 901. In some embodiments, one or more operating parameters of the AHU 934 is altered based on the temperature of the pre-cooling chiller 901, such as flow rate of evaporative media to the adiabatic layer 950, a fan speed of one or more fans of the AHU 934, or damper positions such as that of a bypass damper when no additional cooling of the air is needed after the pre-cooling chiller 901.

Figure 10:
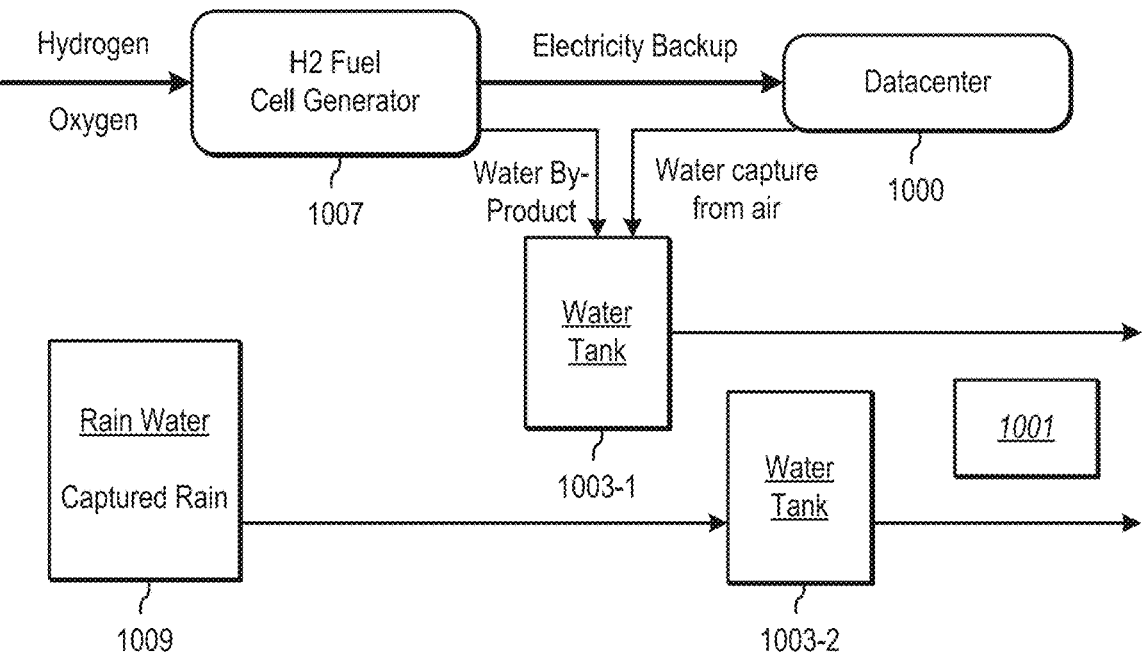
FIG. 10 is a schematic representation of a thermal management system with water recycling from other components of the datacenter, according to at least one embodiment of the present disclosure.

In some embodiments, additional or alternative water sources may be used. FIG. 10 is a schematic representation of water flow to a pre-cooling chiller 1001 or to an AHU such as described in relation to FIG. 9. In some embodiments, the water source is the municipal water supply or a water storage tank, such as described in relation to FIG. 9. In some embodiments, the water source is a hydrogen fuel cell 1007 that produces electricity for the datacenter 1000. A byproduct of the hydrogen fuel cell is water, which is directed to a first water storage tank 1003-1. In some embodiments, water is captured from the air of the datacenter 1000 (such as by condensation) and recycled to a first water storage tank 1003-1 or a second water storage tank 1003-2. In some embodiments, the first water storage tank 1003-1 or a second water storage tank 1003-2 further receives water from a captured rain water source 1009. By recycling water from additional and/or alternative water sources, the datacenter can limit the consumption of water from the municipal water supply.

In at least some embodiments, a thermal management system including a modular adiabatic layer and SCS controlling water flow to the modular adiabatic layer saves water relative to a conventional evaporative thermal management system. Some embodiments can selectively cool affected zones through the modular and selective application of water or other evaporative media to subregions of the modular adiabatic layer.

Figure 11:
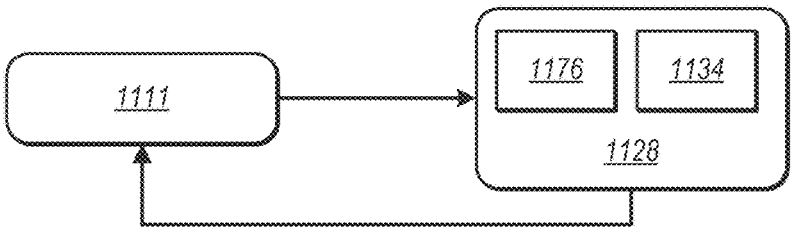
FIG. 11 is a flow diagram illustrating information flow in a datacenter control system, according to at least one embodiment of the present disclosure.

In some embodiments, the SCS is further in data communication with a water aware controller that provides actions, commands, or cooling setpoints to the SCS and/or allocator to cool the racks, rows, rooms, or the datacenter as a whole in a power and water efficient manner. FIG. 11 is an example of an information loop between a water aware controller 1111 and the SCS 1128. In some embodiments, the SCS 1128 is in data communication with and/or controls an SCS engine 1176 and/or an AHU 1134, such as those described in relation to FIG. 2 through FIG. 5. The water aware controller 1111 provides actions, commands, or cooling setpoints based on objective functions received from a user, such as actions, commands, or cooling setpoints that balance thermal management demand with thermal management supply while limiting water consumption from external sources.

In some embodiments, the water aware controller 1111 communicates predictions and actions to the SCS 1128 to meet a cooling setpoint input by a user or other objective function (minimizing water consumption, minimizing carbon intensity, etc.). In some embodiments, the water aware controller 1111 can store and/or predict setpoints based on historical setpoints or setpoint requests. The SCS 1128 implements the action(s) by controlling at least one parameter of an AHU 1134 such as described herein in relation to FIG. 1 through FIG. 9. In some embodiments, the SCS 1128 changes one or more operating parameters of the AHU 1134, and the SCS 1128 transmits datacenter state variables back to the water aware controller 1111. In some embodiments, the datacenter state variables are received at the SCS 1128 by one or more of datacenter sensors, control services (such as the control services 678 described in relation to FIG. 6), an allocator, or other sources in data communication with the SCS 1128 described herein.

In some embodiments, the datacenter state variables include energy consumption (KWh) of the datacenter or portions of the datacenter, power consumption (KW) of the datacenter or portions of the datacenter, water consumption (L) of the datacenter or portions of the datacenter, waste water status and rate (L) of the datacenter or portions of the datacenter, waste heat status and rate (Cal) of the datacenter or portions of the datacenter, IT load utilization (%) of the datacenter or portions of the datacenter, aisle temperature (C) of the datacenter or portions of the datacenter, aisle relative humidity (%) of the datacenter or portions of the datacenter, hardware failure rate per SKU of the datacenter or portions of the datacenter, out of specification server conditions of the datacenter or portions of the datacenter, alarm status of the datacenter or portions of the datacenter, Wet Bulb Global Temperature (WBGT) status of the datacenter or portions of the datacenter, heat block status of the datacenter or portions of the datacenter, cooling system status of the datacenter or portions of the datacenter, and other state variables that provide information as to the current operating conditions of and in the datacenter.

In some embodiments, the SCS 1128 further includes an SCS engine 1176 that calculates and/or determines operational setting and conditions for the AHU 1134. As described herein, the SCS engine 1176 may make such determinations based at least partially on actions or setpoints provided to the SCS engine 1176 by the water aware controller 1111.

In some embodiments, objective functions relate one or more inputs to control variables of the AHU 1134 or other portions of the datacenter. For example, the control variables include, but are not limited to, OA temperature, OA relative humidity, modular adiabatic layer state, quantity of available AHU, water pump speed, AHU fan speed, bypass damper position, etc. Based at least partially on the state variables with values measured by the sensors, the SCS engine 1176 may determine values for at least some of the control variables.

Figure 12:
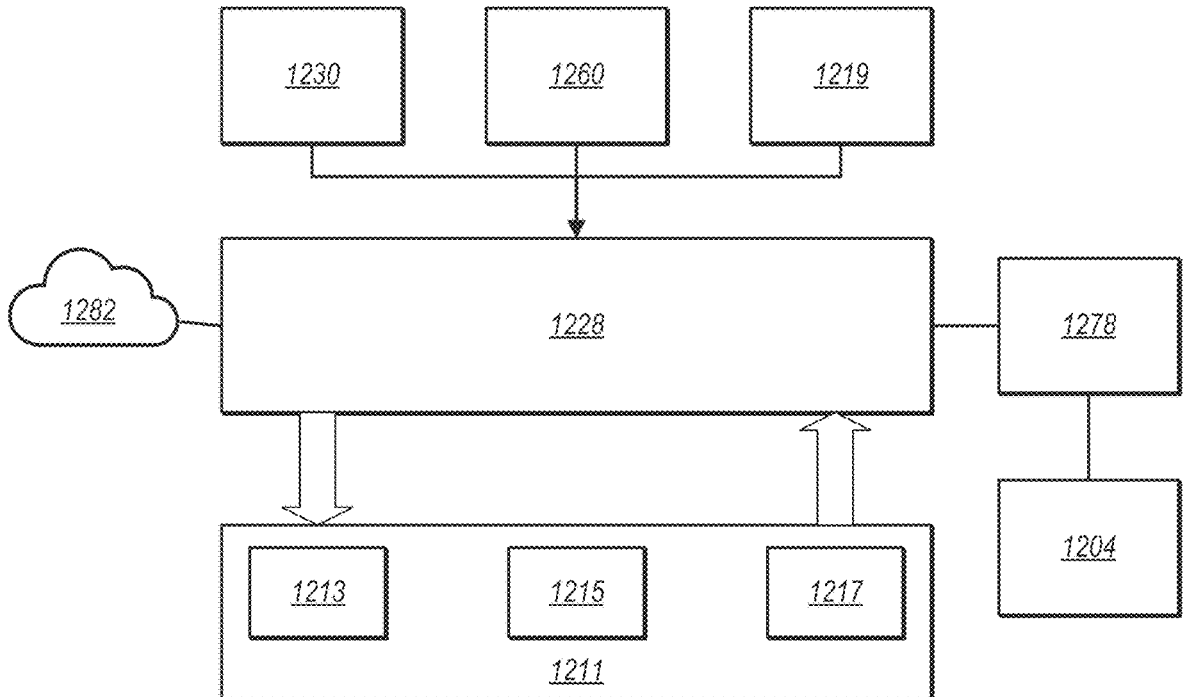
FIG. 12 is a system diagram of a water aware controller communicating with a supervisory control system in a datacenter, according to at least one embodiment of the present disclosure.

In some embodiments, the water aware controller 1111 predicts one or more conditions of datacenter operating conditions and demands based on received information and historical information. For example, FIG. 12 is a flow diagram illustrating communications within a water aware controller 1211 and associated control systems of a datacenter. In some embodiments, the SCS 1228 provides state variables to the water aware controller 1211. The water aware controller 1211 provides a selected action to the SCS 1228.

In some embodiments, the water aware controller 1211 includes a climate engine 1213, a predictor 1215, an action engine 1217, or combinations thereof. The climate engine 1213 receives one or more environmental inputs and determines an environmental prediction that is provided to a predictor 1215. The predictor 1215 receives the state variables from the SCS 1228 and/or the environmental prediction from the climate engine 1213 to predict a datacenter state prediction. The datacenter state prediction is provided to the action engine 1217, and the action engine 1217 selects a selected action, which is provided to the SCS 1228. In some embodiments, the SCS 1228 controls at least one control variable of an AHU, such as described in relation to FIG. 6, based on the selected action. In some embodiments, the SCS 1228 is in data communication with a control service 1278, such as an allocator, to adjust the power demands (and heat generation) of the server computers 1204 or other IT load. Additionally, in some embodiments, the control service 1278 communicates to the SCS 1228 the processing loads, processing allocations, power draws, schedules, and other operating metrics of the devices of the datacenter. For example, the SCS 1228 may be able to proactively adjust the thermal management of the datacenter in response to scheduled computational loads provided by the control service 1278.

In some embodiments, the climate engine 1213 generates an environmental prediction based on a plurality of environmental inputs. For example, the environmental inputs include environmental state variables measured by environmental sensors 1219. In some embodiments, environmental state variables include outdoor temperature (C), relative humidity (%), barometric pressure (Pa), etc.

The environmental sensors 1219 provide current environmental conditions outside the datacenter (i.e., at the source of OA). For example, when the OA temperature is high, additional cooling demand is needed to sufficiently cool the OA before introducing the conditioned air to the cold aisle of the datacenter. In another example, when the relative humidity of the OA is high, an AHU with an adiabatic layer will have a diminished capability to cool the OA before introducing the conditioned air to the cold aisle of the datacenter.

In some embodiments, the climate engine 1213 receives an environmental input including historical climate data. For example, the climate engine obtains historical climate data (such as from the networked services 1282) to extrapolate the probability of changes to the current environmental conditions measured by the environmental sensor(s) 1219. In some embodiments, the climate engine 1213 further obtains local weather forecasts as an environmental input. In some examples, the climate engine 1213 receives the local weather forecast from a networked service 1282. In some embodiments, the local weather forecast provides a forecast 24-96 hours in advance of the current environmental conditions.

In some embodiments, the climate engine 1213 obtains or creates a record of past environmental conditions measured by the environmental sensors 1219. The record of past environmental conditions allows the climate engine 1213 to determine correlations between the measured values of the environmental conditions and the local weather forecast to create an adjustment or other correction to the local weather forecast for the local environmental conditions at the datacenter.

The climate engine 1213, based on the environmental inputs, calculates a localized environmental prediction for the local environmental conditions at the datacenter. The local environmental conditions of the environmental prediction can include the outside temperature, outside relative humidity, outside dew point, and other environmental conditions of the OA used by the datacenter (and the AHUs thereof) to provide conditioned air to the cold aisles.

The predictor 1215 uses state variables provided by the SCS 1228 regarding the current and historical operating conditions of the datacenter to generate a prediction of the internal conditions and IT loads of the datacenter at a future time. In some embodiments, the datacenter state predictions include localized datacenter state predictions for racks, rows, rooms, or other regions of the datacenter.

In some embodiments, the datacenter state predictions include at least temperature values and humidity values for the air in the datacenter. In some embodiments, the datacenter state predictions are based at least partially on recorded values of datacenter sensors 1230 and/or AHU sensors 1260 that measure the air conditions in the datacenter.

In some embodiments, the datacenter state predictions include at least IT load and/or heat generation predictions for the datacenter and/or portions of the datacenter. In some embodiments, the datacenter state predictions are based at least partially on recorded or scheduled IT loads in the datacenter or portions of the datacenter. For example, the IT loads vary based on time of day, day of the week, day of the month, or time of year. The IT loads have a power consumption value associated therewith that determines the heat generated by the server computers 1204 and associated components (such as power supplies and network switches). The datacenter state predictions, therefore, determine a thermal management demand of the datacenter and/or portions of the datacenter.

In some embodiments, the predictor 1215 transmits the datacenter state prediction and the environmental prediction to the action engine 1217. In some embodiments, the predictor 1215 transmits the datacenter state prediction to the action engine 1217, and the climate engine 1213 transmits the environmental prediction to the action engine 1217. In some embodiments, the datacenter state predictions include a thermal management demand at a future time, and the environmental predictions include a thermal management supply at a future time. In some embodiments, based at least partially on the thermal management demand predicted by the datacenter state predictions and the thermal management supply based on the environmental prediction, the action engine 1217 selects one or more selected actions and transmits the selected action(s) to the SCS 1228 for implementation.

In some embodiments, a selected action includes one or more cooling setpoints for the SCS 1228. In some embodiments, the selected action includes sending instructions to a plurality of AHUs to preemptively manage the thermal management supply (e.g., cooling) to the predicted thermal management demand at different portions or locations in the datacenter. As described in relation to FIG. 2 through FIG. 4, different AHUs in the datacenter are associated with cooling different portions of the datacenter, and an AHU with a modular adiabatic layer according to the present disclosure allows granular delivery of conditioned air to various portions or locations in the datacenter. In some embodiments, the SCS 1228 receives the one or more cooling setpoints and instructs one or more AHUs, valves, fans, or other components of the HVAC system in the datacenter to change at least one operating parameter.

In some embodiments, a selected action includes one or more IT load setpoints for the SCS 1228. In some embodiments, the action engine 1217 determines a predicted thermal management demand to exceed a predicted thermal management supply. For example, the predicted IT load of the datacenter or portions of the datacenter exceeds the cooling capacity of the datacenter HVAC system or the AHUs responsible for cooling a portion of the datacenter based on the environmental prediction. In such an embodiment, the action engine 1217 determines that the thermal management supply is unable to manage the heat generated by the predicted datacenter state, and the action engine 1217 transmits to the SCS 1228 instructions to limit and/or migrate at least a portion of the IT load. In some embodiments, the SCS 1228 communicates with a control service 1278 to throttle or power cap one or more server computers 1204, to allocate or reallocate VMs, or migrate IT load from the server computers 1204 to reduce the predicted thermal management demand of the datacenter or portions of the datacenter.

Figure 13:
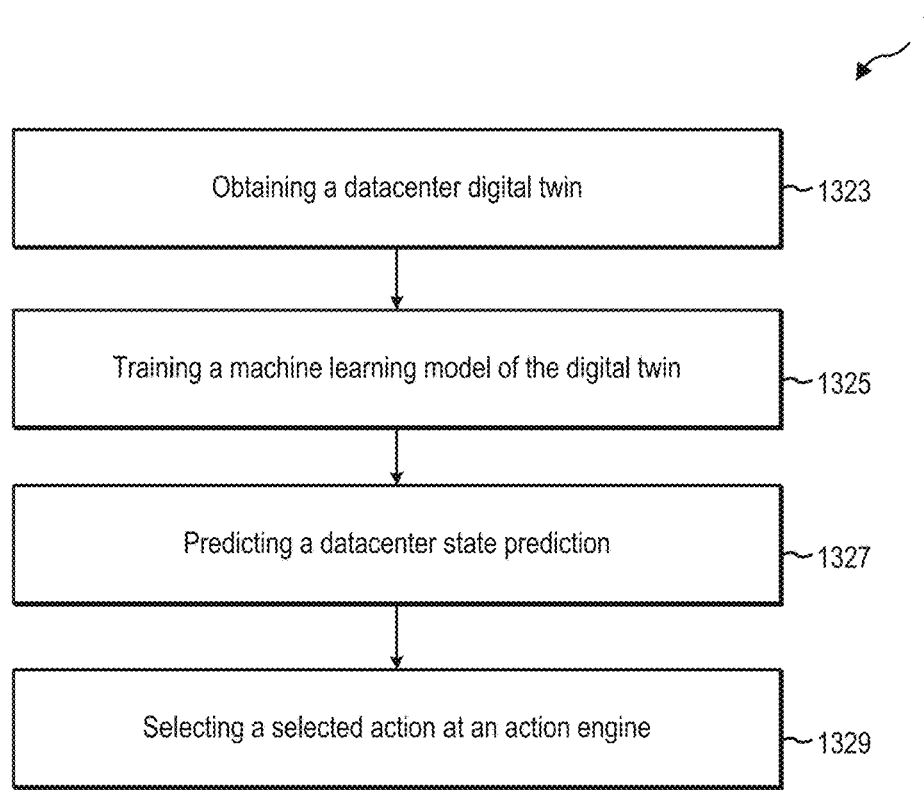
FIG. 13 is a flowchart illustrating a method of thermal management in a datacenter control system, according to at least one embodiment of the present disclosure.

FIG. 13 is a flowchart illustrating a method 1321 of thermal management using a machine learning model to simulate a digital twin of a datacenter, according to some embodiments of the present disclosure. In some embodiments, the method 1321 includes obtaining a datacenter digital twin at 1323. In some embodiments, obtaining a datacenter digital twin includes generating or accessing a white box model of the datacenter. In some embodiments, a white box model is or includes a detailed thermal and mechanical model of the datacenter associated with all active controller algorithms implemented for cooling of the datacenter. In some embodiments, the model calculates the state variables such as indoor temperature, energy, and water consumptions, and byproducts. For example, water consumption and usage is calculated based at least partially on a psychometric model, such as described in relation to FIG. 7.

In some embodiments, obtaining a datacenter digital twin includes generating or accessing a grey box model of the datacenter. In some embodiments, a grey box model is or includes using machine learning model training in combination with information from the SCS such as existing rules to enable and disable portions of the cooling system (e.g., AHUs or portions of AHUs) to improve the accuracy of the grey box model. In some embodiments, the grey box model includes modeling at least one thermodynamic process of the datacenter digital twin with a neural network, other machine learning model, or other control logic.

In some embodiments, obtaining a datacenter digital twin includes generating or accessing a black box model of the datacenter. In some embodiments, a black box model is based on machine learning such as neural network, reinforcement deep learning model, etc., (such as described in relation to FIG. 14) using the input variables such as historic environmental state variables (temperature, relative humidity) and datacenter state variables to determine relationships therebetween and output datacenter state variables.

In some embodiments, the method 1321 further includes training the machine learning model of the digital twin at 1325. In some embodiments, training the machine learning model of the digital twin includes providing at least one training dataset including historic datacenter state variables and correlated historic environmental state variables of the datacenter. In some embodiments, the historic environmental state variables include outdoor temperature (C), relative humidity (%), barometric pressure (Pa), etc., or combinations thereof. In some embodiments, the historic datacenter state variables include energy consumption (KWh) of the datacenter or portions of the datacenter, power consumption (KW) of the datacenter or portions of the datacenter, water consumption (L) of the datacenter or portions of the datacenter, waste water status and rate (L) of the datacenter or portions of the datacenter, waste heat status and rate (Cal) of the datacenter or portions of the datacenter, IT load utilization (%) of the datacenter or portions of the datacenter, aisle temperature (C) of the datacenter or portions of the datacenter, aisle relative humidity (%) of the datacenter or portions of the datacenter, hardware failure rate per SKU of the datacenter or portions of the datacenter, out of specification server conditions of the datacenter or portions of the datacenter, alarm status of the datacenter or portions of the datacenter, Wet Bulb Global Temperature (WBGT) status of the datacenter or portions of the datacenter, heat block status of the datacenter or portions of the datacenter, cooling system status of the datacenter or portions of the datacenter, and other state variables that provide information as to the operating conditions of and in the datacenter. In some embodiments, the datacenter state variables and environmental state variables are correlated by date and time.

In some embodiments, the machine learning model is a neural network model. In some embodiments, the machine learning model is a reinforcement learning model. In some embodiments, the machine learning model of the digital twin determines a plurality of relationships (correlative and/or causal) between the historic state variables.

In some embodiments, the method 1321 further includes predicting a datacenter state prediction at 1327. In some embodiments, predicting a datacenter state prediction includes providing to the digital twin (and the machine learning model thereof) real-time telemetry of the datacenter state variables and the environmental state variables. In some embodiments, predicting a datacenter state prediction includes providing to the digital twin (and the machine learning model thereof) an environmental prediction. In some embodiments, predicting a datacenter state prediction includes providing to the digital twin (and the machine learning model thereof) real-time telemetry of the datacenter state variables and the environmental state variables and an environmental prediction. Based at least partially on the plurality of relationships (correlative and/or causal) between the historic state variables, the real-time telemetry of the datacenter state variables, and the environmental prediction, the machine learning model determines the datacenter state prediction.

The method 1321 further includes, in some embodiments, selecting a selected action at the action engine at 1329 based on the datacenter state prediction of the digital twin (and the machine learning model thereof).

In some embodiments, a selected action includes one or more cooling setpoints for the SCS. In some embodiments, the selected action includes sending instructions to a plurality of AHUs to preemptively manage the thermal management supply (e.g., cooling) to the predicted thermal management demand at different portions or locations in the datacenter. As described in relation to FIG. 2 through FIG. 4, different AHUs in the datacenter are associated with cooling different portions of the datacenter, and an AHU with a modular adiabatic layer, according to the present disclosure, allows granular delivery of conditioned air to various portions or locations in the datacenter. In some embodiments, the SCS receives the one or more cooling setpoints and instructs one or more AHUs, valves, fans, or other components of the HVAC system in the datacenter to change at least one operating parameter.

In some embodiments, a selected action includes one or more IT load setpoints for the SCS. In some embodiments, the action engine determines a predicted thermal management demand to exceed a predicted thermal management supply. For example, the predicted IT load of the datacenter or portions of the datacenter exceeds the cooling capacity of the datacenter HVAC system or the AHUs responsible for cooling a portion of the datacenter based on the environmental prediction. In such an embodiment, the action engine determines that the thermal management supply is unable to manage the heat generated by the predicted datacenter state, and the action engine transmits to the SCS instructions to limit and/or migrate at least a portion of the IT load. In some embodiments, the SCS communicates with a control service to throttle or power cap one or more server computers, to allocate or reallocate VMs, or migrate IT load from the server computers to reduce the predicted thermal management demand of the datacenter or portions of the datacenter.

Figure 14:
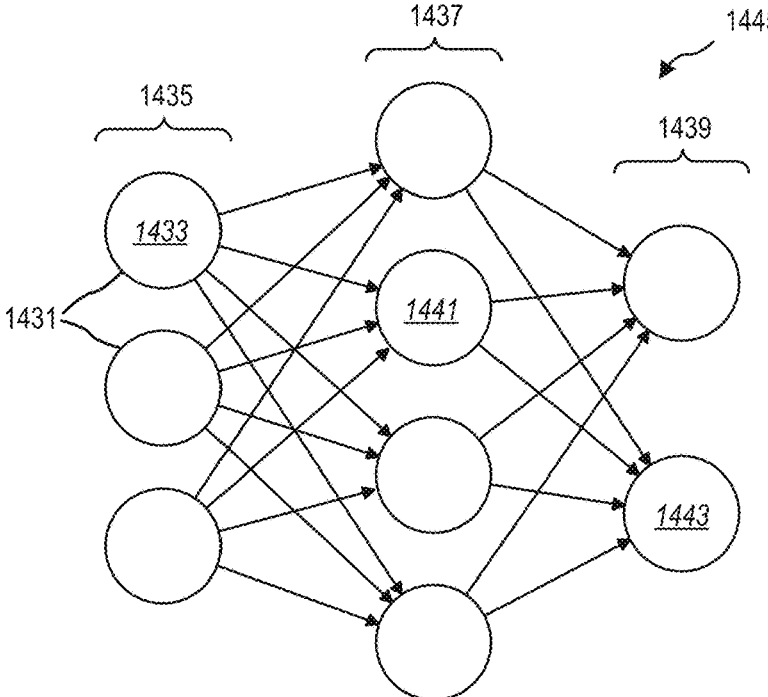
FIG. 14 is a schematic representation of a neural network for use in modeling a datacenter state, according to at least one embodiment of the present disclosure.

FIG. 14 is a is a schematic illustration of a machine learning model including a neural network 1445, such as a large language model. In some embodiments, the neural network has a plurality of layers with an input layer 1435 configured to receive at least one input training dataset 1431 or input training instance 1433 and an output layer 1439, with a plurality of additional or hidden layers 1437 therebetween. The training datasets 1431 can be input into the neural network to train the neural network and identify individual and combinations of labels or attributes of the training instances 1433. In some embodiments, the neural network can receive multiple training datasets 1431 concurrently and learn from the different training datasets 1431 simultaneously. While the illustrated embodiment includes a limited quantity of nodes, it should be understood that, in some embodiments, a neural network has millions, billions, or more of nodes 1441 in the input layer 1435, hidden layers 1437, output layer 1439, or combination thereof.

In some embodiments, a machine learning system includes a plurality of machine learning models that operate together. Each of the machine learning models has a plurality of hidden layers 1437 between the input layer 1435 and the output layer 1439. The hidden layers 1437 have a plurality of input nodes (e.g., nodes 1441), where each of the nodes 1441 operates on the received inputs from the previous layer. In a specific example, a first hidden layer 1437 has a plurality of nodes and each of the nodes performs an operation on each instance from the input layer 1435. Each node of the first hidden layer 1437 provides a new input into each node of the second hidden layer, which, in turn, performs a new operation on each of those inputs. The nodes of the second hidden layer then passes outputs, such as identified clusters 1443, to the output layer 1439.

In some embodiments, each of the nodes 1441 has a linear function and an activation function. The linear function may attempt to optimize or approximate a solution with a line of best fit, such as reduced power cost or reduced latency. The activation function operates as a test to check the validity of the linear function. In some embodiments, the activation function produces a binary output that determines whether the output of the linear function is passed to the next layer of the machine learning model. In this way, the machine learning system can limit and/or prevent the propagation of poor fits to the data and/or non-convergent solutions.

The machine learning model includes an input layer 1435 that receives at least one training dataset 1431. In some embodiments, at least one machine learning model uses supervised training. In some embodiments, at least one machine learning model uses unsupervised training. Unsupervised training can be used to draw inferences and find patterns or associations from the training dataset(s) 1431 without known outputs. In some embodiments, unsupervised learning can identify clusters 1443 of similar labels or characteristics for a variety of training instances 1433 and allow the machine learning system to extrapolate the performance of instances with similar characteristics.

In some embodiments, semi-supervised learning can combine benefits from supervised learning and unsupervised learning. As described herein, the machine learning system can identify associated labels or characteristics between instances, which may allow a training dataset 1431 with known outputs 1439 and a second training dataset 1431 including more general input information to be fused. Unsupervised training can allow the machine learning system to cluster the instances from the second training dataset without known outputs and associate the clusters with known outputs from the first training dataset. The values of the output layer 1439, in some embodiments, are compared to known values of training instances 1433, and parameters associated with each node 1441 of the hidden layer(s) 1437 allow back propagation through the neural network to refine and train the neural network.

INDUSTRIAL APPLICABILITY

The present disclosure relates generally to systems and methods for thermal management of electronic devices or other heat-generating components. More particularly, the present disclosure relates to thermal management of electronic devices or other heat-generating components in a datacenter using a heating, ventilation, and air conditioning (HVAC) system for the datacenter. In some embodiments, the HVAC system includes at least one air handling unit (AHU) that including a modular adiabatic layer. The modular adiabatic layer is selectively wet with an evaporative medium in subregions of the modular adiabatic layer. The selective wetting of subregions, in some embodiments, allows more precise control of the adiabatic cooling of air passed through the modular adiabatic layer. The selective wetting of subregions, in some embodiments, allows for correlation with and control of air conditioning in affected zones downstream from the AHU.

Datacenters include a plurality of electronic devices, some of which are computing devices, that all generate thermal energy. The thermal energy needs to be transported away from the electronic devices to prevent damage to the electronic devices and/or protect the integrity of the data stored and/or computed on the electronic devices. Datacenters use thermal management systems to carry thermal energy away from the electronic devices by liquid cooling, air cooling, or a combination thereof. Even in liquid cooled systems, the liquid cooling may efficiently conduct thermal energy from the electronic devices but ultimately reject the thermal energy from the warmed fluid (e.g., liquid or vapor) into the ambient atmosphere. The warmed ambient air must then be moved from the liquid cooling system and/or the electronic devices to complete the thermal management of the electronic devices, which may be inefficient.

In some embodiments of datacenters and thermal management systems, according to the present disclosure, a plurality of heat generating devices are located in an enclosed space and air is moved through an AHU to condition the air around the server racks and devices housed therein. While the present disclosure will describe the use of airflow to cool heat-generating devices directly, such as cooling computing devices, hardware storage devices, networking devices, power supplies, and other electronic devices, it should be understood that the thermal management system may use liquid cooling fluid flow to cool heat sinks of heat-generating components.

In some embodiments, a conventional datacenter includes a thermal management system. An example environment in which thermal management systems and methods according to the present disclosure may be used is a server array. In some embodiments, the datacenter includes server computers arranged in a row, where the row contains a plurality of server racks, each of which contain a plurality of server computers, power supplies, networking devices, and other electronic devices. In some examples, the server computer is a blade server. In some examples, the server computers are complete computers (e.g., each server computer can function as a standalone computer). In some examples, the server computers are electronic components that can cooperate to provide scalable computational power.

The server row can include a row manager that is in communication with the server racks and/or rack manager of the server row. In some embodiments, the row manager controls computational loads, such as process allocations, of the server racks and/or server computers. In doing so, the row manager may control the amount of heat generated by the server computers of the server racks. In some embodiments, the row manager controls thermal management of the server racks and/or server computers. For example, the row manager can manage active thermal management for the server racks and/or server computers by changing fan speed or by controlling the flow rate of a cooling fluid for liquid cooling systems. In at least one example, the server row is at least partially cooled by a liquid cooling system that delivers cooling fluid to the server racks of the server row. The row manager is in communication with the cooling fluid pump to change or stop the flow of cooling fluid.

A server rack can support a plurality of server computers in the rack. The server computers may each have liquid cooling, such as localized immersion cooling, for at least some electronic components of the server computer, or a cooling plate with recirculating cooling fluid to cool the electronic component(s) of the server computer. In some embodiments, the server computers or other electronic devices may be air-cooled, utilizing a cold aisle and a hot aisle that flow colder air from the cold aisle and evacuate hotter air from the electronic devices through the hot aisle. The air flows from the cold aisle to the hot aisle based on air pressure differentials established by pumps or blowers of the thermal management system in series with the cold aisle and the hot aisle.

In some embodiments, the electronic components, such as server computers, of the server rack are connected to a rack manager. The rack manager may control power delivery to the server computers or other electronic components. In some embodiments, the rack manager may communicate with the server computers or other electronic components to power cap or throttle the server computers or other electronic components and manage power draw. The rack manager, in some embodiments, is also connected to a cooling fluid pump that moves cooling fluid to one or more server computers or other electronic components in the server rack.

In some embodiments, a supervisory control system (SCS) is connected to the row manager and/or rack manager (s) to communicate with the electronic devices and/or is connected to datacenter sensors to measure one or more properties or operating conditions of the thermal management system.

The SCS includes a processor and a hardware storage device. The processor may receive information from the datacenter sensors and communicate with one or more other devices according to instructions stored on the hardware storage device that cause the processor to perform any of the methods described herein. In some embodiments, the devices in communication with the SCS that may receive instructions from the SCS in response to detecting an increase in temperature include a cooling fluid pump, fan, valve, another thermal management device (e.g., blower), or combinations thereof. For example, the SCS may adjust the flow of cooling fluid by turning on the cooling fluid pump or by actuating a valve to direct airflow.

The hardware storage device can be any non-transient computer readable medium that may store instructions thereon. The hardware storage device may be any type of solid-state memory; volatile memory, such as static random access memory (SRAM) or dynamic random access memory (DRAM); non-volatile memory, such as read-only memory (ROM) including programmable ROM (PROM), erasable PROM (ERPOM) or EEPROM; magnetic storage media, such as magnetic tape; a platen-based storage device, such as hard disk drives; optical media, such as compact discs (CD), digital video discs (DVD), Blu-ray Discs, or other optical media; removable media such as USB drives; non-removable media such as internal SATA or non-volatile memory express (NVMe) style NAND flash memory; or any other non-transient storage media.

The air is provided to the entire row and/or rack to cool the ambient air around the components of the rack. Cooling the entire environment may not be necessary and, in fact, inefficient, when the heat generation by the components of the server computers and other electronic devices is uneven. For example, a central processing unit (CPU) or system memory of the server computer may generate considerably greater heat than a non-volatile storage device. To limit and/or prevent thermal damage to the CPU, however, the entire ambient air is cooled based off of the CPU temperature and load. Localized cooling can efficiently cool the hottest areas and/or components without expending additional energy to cool the entire room in which the row or rack is located.

In some embodiments, a thermal management system, according to the present disclosure, provides granular control over cooling rates and locations. In some embodiments, a SCS or other control system is in data communication with an AHU (such as an AHU providing conditioned air to the cold aisle, or to other locations in the datacenter) to efficiency cool the datacenter based on different thermal demands between server computers, rows, racks, or other locations in the datacenter. In some embodiments, water in the datacenter can be used or reused to efficiently and selectively maintain target operating temperatures in the datacenter.

In some embodiments, an AHU is used to condition air for a cold aisle in a datacenter. In some embodiments, the AHU intakes outside air (OA) through an intake. In some embodiments, the intake includes dampers, valves, or other mechanisms to limit or control airflow through the intake. In some embodiments, the intake remains open while the airflow through the AHU is controlled by other dampers, valves, fans, blowers, or other mechanisms in the AHU, as will be described.

The AHU, in some embodiments, includes a pre-conditioner configured to convectively cool or heat the OA received at the intake. For example, the pre-conditioner may include a thermal coil that is maintained at or less than a target temperature below an intake temperature of the OA to cool the OA and create a pre-conditioned air. In another example, the pre-conditioner may include a thermal coil that is maintained at or above a target temperature greater than an intake temperature of the OA to heat the OA and create a pre-conditioned air. In some examples, the pre-conditioner is water-cooled or water-heated. In some examples, the pre-conditioner is heated or cooled through an electrical heater (e.g., a resistive heater) or electric cooler (e.g., a Peltier-style cooler).

In embodiments with a pre-conditioner, a first portion of the pre-conditioned air is passed through a chiller damper an adiabatic layer, and a second portion of the pre-conditioned air is passed to a bypass damper to bypass the adiabatic layer. In embodiments without a pre-conditioner, a first portion of the OA is passed through a chiller damper, an adiabatic layer, and a second portion of the OA is passed to a bypass damper to bypass the adiabatic layer. The chiller damper and bypass damper, in some embodiments, selectively open and close to direct a selected proportion of air through the bypass and the adiabatic layer to control the temperature and the humidity of the air exhausted after the bypass and the adiabatic layer. In some embodiments, an AHU includes only a chiller damper that selectively allows a first portion of the air to pass through the adiabatic layer and a second portion to always pass through the bypass. In some embodiments, an AHU includes only a bypass damper that selectively allows a second portion of the air to pass through the bypass, while a first portion is always allowed to pass through the adiabatic layer.

The adiabatic layer cools the air passed therethrough by evaporation of evaporative media in the adiabatic layer. For example, the adiabatic layer may be wet by water or other evaporative media that, through convective cooling and the evaporation of the evaporative media, cool the first portion of the air. In some embodiments, the adiabatic layer also humidifies the first portion of the air. The balance of the first portion and the second portion passed through the adiabatic layer and the bypass, respectively, determines the output humidity and output temperature of the exhausted air.

In some embodiments, the AHU includes one or more fans, blowers, or other components to move or urge air through the AHU. While in some embodiments, the AHU includes fans located after the adiabatic layer, it should be understood that the fans, blowers, or other components to move or urge air through the AHU may be located elsewhere in the AHU in addition to or alternative to the fans located after the adiabatic layer.

The AHU produces conditioned air to the cold aisle or other portions of the datacenter. In some embodiments, the AHU produces a plurality of columns of conditioned air that are exhausted from the AHU and flow to different regions of the cold aisle or other portion of the datacenter. In some embodiments, the different columns of conditioned air have different properties (e.g., temperature, humidity, density, velocity, turbidity) that affect the direction and/or thermal management capacity (e.g., cooling capacity, heating capacity, humidifying capacity) of the column of conditioned air.

For example, the first column of conditioned air is located in a lower portion of the AHU in series after the adiabatic layer, and the third column of conditioned air is located in an upper portion of the AHU in series after the bypass of the AHU. The first column and third column may have different properties, such as different temperature, different humidity, and different density.

In some embodiments, the AHU includes one or more conditioned air sensors configured to measure one or more properties of the conditioned air exhausted from the AHU. In embodiments including one or more intake sensors, the AHU may measure and/or calculate a change in properties of the air through the AHU (from the OA to the columns of conditioned air). The AHU can report the properties and/or changes in properties measured by the sensor(s) to the SCS.

In some embodiments, at least part of the first portion of the air (passed through the adiabatic layer) and the second portion of the air (passed through the bypass) mix between the first column and the third column in a second column. The second column containing mixed air can have properties different from either the first column or the third column. In some embodiments, the different columns or portions of the conditioned air may exhaust to different locations or components of the datacenter based on the properties of the conditioned air. In some embodiments, the different columns or portions of the conditioned air may exhaust to different locations or components of the datacenter based on the HVAC ducts of the thermal management system of the datacenter. Understanding the localization of the exhausted conditioned air and the properties thereof can allow an SCS in communication with the AHU to provide conditioned air with desired properties to the associated portions of the datacenter.

In some embodiments, differences in the evaporative media or the location of the evaporative media on the adiabatic layer creates variations in the conditioned air exhausted from the AHU. For example, the distribution of evaporative media on the adiabatic layer can create variations in the first column of conditioned air. Understanding and controlling the variations in the conditioned air, and understanding and controlling where the conditioned air moves in the datacenter, can allow more precise control of the air in the datacenter for thermal management.

In some embodiments, an AHU includes a modular adiabatic layer. For example, a modular adiabatic layer may be used with the AHU described herein. In some embodiments, a modular adiabatic layer includes a plurality of evaporative media conduits and evaporative media valves configured to direct and/or supply evaporative media to an evaporative substrate of the modular adiabatic layer. The evaporative media valves are positioned in line with the evaporative media conduits to selectively allow, control, or prevent flow of evaporative media to the evaporative substrate. In some embodiments, the plurality of evaporative media conduits allow delivery of evaporative media to a plurality of subregions of the evaporative substrate.

In some embodiments, an SCS is in data communication or electrical communication with the evaporative media valves to control a flowrate of the evaporative media through the evaporative media valves and to the subregions. By controlling the flow to the subregions, the SCS can control the amount and location of cooling and humidifying of the air passed through the modular adiabatic layer. In some embodiments, the SCS is further in communication with datacenter sensors, AHU sensors, external environmental sensors that measure and/or report environmental information outside of the datacenter (from where the OA is drawn), other sensors, and combinations thereof. In some embodiments, the SCS determines how much evaporative media to provide to the evaporative substrate and to which subregions.

In some embodiments, a modular adiabatic layer with evaporative media wets five subregions of the evaporative substrate. Air passing through the evaporative substrate of the modular adiabatic layer may be cooled more in the locations of the subregions wetted by the evaporative media. In some embodiments, the evaporative substrate has a greater quantity of subregions wetted by the evaporative media. For example, as an environmental sensor or an intake sensor in communication with the SCS indicates that a temperature of the OA entering the AHU increases, the SCS may instruct or control the evaporative media valves to provide more evaporative media to the evaporative substrate and/or to more subregions of the evaporative substrate. In another example, a datacenter sensor or conditioned air sensor in communication with the SCS indicates that a humidity of the OA exhausted from the AHU is greater than desired, and the SCS may instruct or control one or more evaporative media valves to provide less evaporative media to the evaporative substrate and/or to less subregions of the evaporative substrate. In some embodiments, further increases in cooling and/or humidification are needed, and an evaporative substrate has all subregions wetted by an evaporative media. In some embodiments, all subregions are wetted, and the SCS can further control the amount of cooling and/or humidification by the quantity of evaporative media delivered to each subregion.

In some embodiments, the material of the evaporative substrate provides different properties based at least partially on the material. For example, wicking rates, fluid retention rates, surface area, drying rates, flowrates of air therethrough, etc., may vary based on the porosity, density, and construction of the substrate material. In some embodiments, the evaporative substrate includes different substrate materials in different subregions such that wetting the different subregions of the evaporative substrate wets different substrate materials with different properties.

In some embodiments, at least a portion of the evaporative substrate includes a cellulose-based substrate material. For example, the substrate material may be or include paper, shredded paper, cellulose pulp, or other cellulose-based substrate materials. In some embodiments, the substrate material includes an organic textile. For example, the substrate material may be or include wool, silk, cotton, etc. In some embodiments, the substrate material includes a synthetic textile. For example, the substrate material may be or include polypropylene, nylon, aramid fibers, etc. In some embodiments, the substrate material includes ceramic materials. For example, the substrate material may be or include ceramic plates, fins, pins, rods, cylinders, meshes, etc. In some embodiments, the substrate material includes a metal. For example, the substrate material may be or include a metal plate, pin, fin, mesh, grid, rod, foam, etc.

In some embodiments, the substrate material is microporous. For example, a microporous substrate material has a porosity less than 1000 micrometers. In some embodiments, the substrate material is nanoporous. For example, a nanoporous substrate material has a porosity less than 1.0 micrometer. In some embodiments, the substrate material is nonporous. For example, a nonporous substrate material has a porosity substantially equal to zero.

In some embodiments, an AHU is in communication with an SCS to direct conditioned air for cooling at certain server computers in a rack. In some embodiments, the AHU includes a modular adiabatic layer with a plurality of subregions of the evaporative substrate. The SCS controls one or more evaporative media valves. The evaporative media valves control a flowrate of evaporative media through the evaporative media conduit(s) that provide the evaporative media to the subregions.

In some embodiments, the SCS is in communication with a plurality of sensors, such as conditioned air sensors or rack sensors. In some embodiments, the rack sensors are component sensors that measure and/or report operating conditions of an electronic component or air conditions at the electronic component. For example, the rack sensors may be component temperature sensor, a component humidity sensor, or a component barometer. The SCS can receive information measured by the sensors in response to changes bade to the AHU by the SCS. In some examples, the SCS is in communication with a fan configured to intake OA and direct airflow at the modular adiabatic layer. The air passes through the modular adiabatic layer and is exhausted from the AHU as conditioned air.

In some embodiments, different portions of the conditioned air flow toward different areas of the datacenter and devices therein. For example, a first column of conditioned air flows toward a first server computer of a server rack. A first conditioned air sensor in or adjacent to the first column of conditioned air provides information to the SCS regarding air properties of the first column of conditioned air exhausted from the AHU. In some embodiments, a second conditioned air sensor in or adjacent to the second column of conditioned air provides information to the SCS regarding air properties of the second column of conditioned air exhausted from the AHU. In some embodiments, a third conditioned air sensor in or adjacent to the third column of conditioned air provides information to the SCS regarding air properties of the third column of conditioned air exhausted from the AHU.

In some embodiments, the first column of conditioned air (near the bottom of the modular adiabatic layer and/or the bottom of the AHU) flows toward a first server computer of a server rack, and a first rack air sensor located at or near the bottom of the server rack provides information to the SCS regarding air properties at the first server computer of the server rack. In some embodiments, the second column of conditioned air (near the middle of the modular adiabatic layer and/or the middle of the AHU) flows toward a second server computer of a server rack, and a second rack air sensor located at or near the middle of the server rack provides information to the SCS regarding air properties at the second server computer of the server rack. In some embodiments, the third column of conditioned air (near the top of the modular adiabatic layer and/or the top of the AHU) flows toward a third server computer of a server rack, and a third rack air sensor located at or near the top of the server rack provides information to the SCS regarding air properties at the third server computer of the server rack.

In some embodiments, the SCS, by monitoring changes in the air properties measured by the AHU sensors (e.g., conditioned air sensors) and datacenter sensors (e.g., rack sensors), can determine how changes to the AHU operations affect the air properties in different affected zones of the datacenter. For example, the third server computer at or near the top of the server rack may require more thermal management capacity (e.g., cooling) because the air is warmer near the top of the server rack, as measured by the third rack sensor. In some examples, wetting the fourth subregion of the modular adiabatic layer cools the third column of conditioned air more than the first column or second column, and the third column of conditioned air (near the top of the modular adiabatic layer and/or the top of the AHU) is determined to have a greater effect on the third server computer at the top of the server rack. By correlating a wetting pattern or other operating condition of the modular adiabatic layer and/or the AHU to the information provided by the third rack sensor proximate the third server computer, the SCS can determine that the area (and devices) near the third rack sensor is an affected zone of the fourth subregion and/or third column of the AHU.

An affected zone is an area, volume, region, or location in the datacenter for which the air measured to be affected by changes to the operating conditions of the AHU. For example, an affected zone may be affected by changes to wetting of different subregions of the modular adiabatic layer, the amount of evaporative media applied to the evaporative substrate, the AHU fan speed (e.g., of the fan), or other operating conditions of the AHU. In at least one example, the AHU includes a fan located before the modular adiabatic layer in the direction of the airflow therethrough and a fan located after the modular adiabatic layer in the direction of the airflow. A fan, blower, or other mechanism for moving the air through the AHU may mix air exposed to the fan. Therefore, the correlated effect of the AHU to the affected zone may change depending on the fan speed and also the relative location of the fan in the AHU. The SCS may change the fan speed or a selected operating fan to adjust the effect on the affected zone.

In some embodiments, an affected zone may be measured by devices, such as server computers in a rack. In such examples, the SCS may measure or receive a thermal demand request from a device or sensor associated with the affected zone, and the SCS may change at least one operating condition of the AHU to change the thermal management supplied to the affected zone.

In some embodiments, an affected zone may be measured by rack, such as individual server racks in a row. In such examples, the SCS may measure or receive a thermal demand request from a rack manager, row manager, or sensor associated with the affected zone, and the SCS may change at least one operating condition of the AHU to change the thermal management supplied to the affected zone.

In some embodiments, an SCS is in communication with an AHU and datacenter sensors associated with rooms containing different server rows. In some embodiments, an affected zone may be measured by row, such as individual server rows. In such examples, the SCS may measure or receive a thermal demand request from row manager or datacenter sensor associated with the affected zone, and the SCS may change at least one operating condition of the AHU to change the thermal management supplied to the affected zone.

In some embodiments, the first column of conditioned air (near the bottom of the modular adiabatic layer and/or the bottom of the AHU) flows toward a first server room containing a first server row, and a first datacenter air sensor located at or near the first server row provides information to the SCS regarding air properties at the first server row. In some embodiments, the second column of conditioned air (near the middle of the modular adiabatic layer and/or the middle of the AHU) flows toward a second server room containing a second server row, and a second datacenter air sensor located at or near the second server row provides information to the SCS regarding air properties at the second server row. In some embodiments, the third column of conditioned air (near the top of the modular adiabatic layer and/or the top of the AHU) flows toward a third server room containing a third server row, and a third datacenter air sensor located at or near the third server row provides information to the SCS regarding air properties at the third server row.

In some embodiments, the SCS, by monitoring changes in the air properties measured by the AHU sensors (e.g., conditioned air sensors) and datacenter sensors (e.g., datacenter air sensors), can determine how changes to the AHU operations affect the air properties in different affected zones of the datacenter. For example, the third server row may require more thermal management capacity (e.g., cooling) because the server room containing the third server row is located on a Southern side of the datacenter and exposed to more sunlight than a first server room located on a Northern side of the datacenter. As will be described in more detail herein, the SCS may correlate thermal demand of affected zones to weather, time, or other repeating conditions to predict thermal demand and prepare for the thermal demands in advance.

In some embodiments, a thermal demand request is any measurement, report, communication, or information that is received, calculated, or obtained by the SCS in relation to current or future temperature of the datacenter or region of the datacenter. For example, a thermal demand request may be received from a device in the datacenter. A device may include a temperature sensor, and the device may transmit a thermal demand request based at least partially on the temperature of or at the device. In some examples, the device may transmit the thermal demand request based at least partially on a power draw of the device, which indicates an increase in thermal energy produced by the device. In some examples, the device may transmit the thermal demand request based at least partially on a computational load of the device, which indicates an increase in thermal energy produced by the device. In some embodiments, the thermal demand request is received from a rack manager, a row manager, a control system, such as virtual machine (VM) allocator, or other control device that transmits the thermal demand request based at least partially on a thermal energy production of a device of the datacenter.

In some embodiments, the thermal demand request is obtained by the SCS from a network connection or from another control service of the datacenter, such as a VM allocator. For example, the SCS may request information from the VM allocator or other control service of the datacenter without waiting to receive the thermal demand request. In some embodiments, the SCS obtains the thermal demand request based at least partially on a measurement of one or more datacenter sensors that measure temperature, humidity, power draw, liquid cooling demands, etc. In at least one example, an increase in demand for liquid cooling or immersion cooling working fluid may indicate an increase in the thermal energy being exhausted into the datacenter air and may indicate an impending thermal demand request.

In other examples, the SCS may obtain environmental information from one or more environmental sensors (such as external temperature sensors, humidity sensors, barometers, etc.) and/or network-based environmental information sources, such as weather reports. The weather reports may allow the SCS to determine a temperature or humidity of outside air that is brought into the datacenter. In some embodiments, the environmental information and/or weather reports may indicate future environmental conditions and/or weather conditions for which the SCS can prepare the datacenter.

In yet other examples, the SCS may obtain a thermal demand request based on a report or determination calculated by the SCS. For example, the SCS may calculate a thermal demand need for one or more affected zones of the datacenter based on past trends indicating increased computational demands during adverse weather conditions. In at least one example, more users may request datacenter services when the weather includes precipitation or high winds and users are more likely to be indoors.

In some embodiments, thermal demand may be related to computational conditions of the datacenter. A thermal demand request or need may be calculated by on a processing load, power draw, bandwidth consumption, VM allocations, or process allocations of devices or racks in the datacenter. Such information may be reported to the SCS by devices, rack managers, row managers, or other control services.

In some embodiments, an SCS is in communication with a plurality of components, devices, and services. In some embodiments, the SCS is in data communication with a plurality of sensors in the datacenter and the HVAC system. For example, the SCS may be in data communication with cold aisle sensors and/or hot aisle sensors of the HVAC system, conditioned air sensors and/or intake sensors of an AHU, rack sensors, datacenter sensors, and other sensors, such as temperature sensors on the server computers or other devices throughout the datacenter. The plurality of sensors provide information to the SCS.

In some embodiments, the SCS is further in data communication with a control service such as an allocator service that allocates processes and/or VM to devices in the datacenter. The control service may communicate to the SCS the processing loads, processing allocations, power draws, schedules, and other operating metrics of the devices of the datacenter. For example, the SCS may be able to proactively adjust the thermal management of the datacenter in response to scheduled computational loads provided by the control service.

In some embodiments, the SCS is in data communication with a network through which the SCS can obtain additional information relevant to the operations and thermal management of the datacenter from one or more networked services. In at least one example, the networked services include the local or regional weather forecast, which may not be available from the local sensors of the datacenter. In other examples, the networked services may include local pricing, availability, or demand for utility grid electricity and/or municipal water. In some embodiments, the SCS may determine a quantity or wetting pattern of water applied to a modular adiabatic layer of the AHU based at least partially on the local pricing, availability, or demand for utility grid electricity and/or municipal water. For example, when utility grid electricity pricing is high, the SCS may rely more on adiabatic cooling of air in the AHU, and when water availability is limited, the SCS may rely more on airflow through the HVAC system by increasing a fan speed of the AHU or other fans in the HVAC system.

The inputs from the sensors, the control services, networked services, and other sources are, in some embodiments, provided to an SCS engine that calculates and/or determines operational setting and conditions for an AHU. As described herein, the SCS engine may make such determinations based at least partially on Constraints and Objective functions provided to the SCS engine.

In some embodiments, the objective functions relate one or more inputs to control variables of the AHU or other portions of the datacenter. For example, the control variables include, but are not limited to, OA temperature, OA relative humidity, modular adiabatic layer state, quantity of available AHU, water pump speed, AHU fan speed, bypass damper position, etc. Based at least partially on the state variables with values measured by the sensors, the SCS engine may determine values for at least some of the control variables.

In some embodiments, at least some of the control variables are determined based on a psychrometric chart. The psychrometric chart relates the change in relative humidity based on temperature. The x-axis is the dry-bulb temperature, which is the temperature indicated by a thermometer exposed to the air in a place sheltered from direct solar radiation. The dry bulb temperature measures the temperature of the air. The relative humidity curve is the ratio of the mole fraction of water vapor to the mole fraction of saturated moist air at the same temperature and pressure. For example, the y-axis reflects the humidity ratio, and is the proportion of mass to water vapor per unit mass of dry air. The relative humidity illustrates the percentage of the humidity ratio for a given temperature and pressure for the air. As the dry bulb temperature decreases during the cooling process, the relative humidity for a given quantity of water in the air increases, allowing additional water to be introduced to the air as humidity ratio.

In some embodiments, the SCS determines how much water to introduce to the modular adiabatic layer and/or a fan speed of the AHU based at least partially on a setpoint for relative humidity. Exceeding a dewpoint in the datacenter may cause condensation, and therefore, the SCS may determine values for control variables to avoid condensation. In at least some embodiments, a psychrometric evaluation of the relative humidity and/or dry bulb temperature can allow the SCS to determine a fan speed and/or flowrate for the AHU to produce a target cooling in an affected zone without causing condensation in the affected zone.

In some embodiments, a method of thermal management in a datacenter includes obtaining thermal demand information (e.g., a thermal demand request), obtaining water source information, and obtaining power source information.

In some embodiments, the method includes, at the SCS and based at least partially on the thermal demand information, the water source information, and the power source information, determining a water flowrate through an evaporative media valve to a first subregion of a modular adiabatic layer of an AHU, such as described herein. The SCS adjusts the evaporative media valve and/or instructs the evaporative media valve to provide the water flowrate to the first subregion of the modular adiabatic layer. Air that flows through the modular adiabatic layer is conditioned by the convective cooling and humidification of the water (or other evaporative media).

In some embodiments, the method includes measuring at least one property of the conditioned air. In some embodiments, the measured property of the conditioned air is compared to at least one property of an intake air before conditioning. The SCS may make further adjustments to the flowrate of the water or other evaporative media based at least partially on the measured value of the property.

The method, in some embodiments, further includes determining a fan speed of a fan in communication with the conditioned air. The SCS may then set the fan speed or instruct the fan to set the fan speed to the determined fan speed. In some embodiments, the fan speed is determined based at least partially on the flowrate of the water. For example, the airflow through the modular adiabatic layer may evaporate a portion of the water or other evaporative media at substantially an equal rate to the flowrate of water or other evaporative media to the evaporative substrate of the modular adiabatic layer.

In some embodiments, the fan is upstream of the modular adiabatic layer. For example, the fan may be before the modular adiabatic layer in the direction of the airflow. In some embodiments, the fan is downstream of the modular adiabatic layer. For example, the fan may be after the modular adiabatic layer in the direction of the airflow. The conditioned air passed through different subregions of the evaporative substrate may mix by different amounts based at least partially on the relative location of the fan to the evaporative substrate. In at least one embodiment, the fan is in the AHU.

The method, in some embodiments, further includes determining an affected zone affected by the first subregion. For example, the flowrate of water or other evaporative media to the first subregion and/or fan speed may be determined based at least partially on a measured or calculated relationship between the AHU operating conditions and sensor information provided from a sensor located at an affected zone.

In some embodiments, a pre-cooling chiller is in fluid communication with a water storage tank, according to some embodiments of the present disclosure. In some embodiments, the pre-cooling chiller is part of the AHU. In some embodiments, the pre-cooling chiller is separate from and/or positioned before the AHU containing the modular adiabatic layer. The water storage tank and/or the pre-cooling chiller are configured to receive water from a municipal water supply. When the municipal water supply has available water, the pre-cooling chiller may receive water directly from the municipal water supply. In some embodiments, the pre-cooling chiller receives water from the water storage tank.

In at least one embodiment, the water in the water storage tank is recycled water that is recaptured after cycling through the pre-cooling chiller. For example, the water is received from the municipal water supply and directed into the pre-cooling chiller where the water cools the OA before a first portion of the water is directed through an evaporative media conduit to the modular adiabatic layer to further condition the air. In some embodiments, at least a second portion of the water is recycled to the water storage tank. The water in the water storage tank may be directed for additional cycles through the pre-cooling chiller and/or directed to the modular adiabatic layer through the evaporative media conduit.

In some embodiments, a tank controller is in communication with one or more water sensors to measure inlet and outlet temperatures of the water entering and exiting the pre-cooling chiller. In some embodiments, the tank controller alters a state of one or more valves to direct water flow from the water storage tank and/or the municipal water supply to adjust and inlet temperature of the water entering the pre-cooling chiller. For example, the water stored in the water storage tank may be of a higher temperature than the water of the municipal water supply, and the tank controller may adjust a ratio of the municipal water and the tank water entering the pre-cooling chiller to adjust the inlet temperature.

In some embodiments, the AHU is in data communication with the tank controller and/or the water sensors. For example, an SCS or another controller of the AHU may communicate with the tank controller and/or the water sensors to measure a water temperature of the pre-cooling chiller. In some embodiments, one or more operating parameters of the AHU is altered based on the temperature of the pre-cooling chiller, such as flow rate of evaporative media to the adiabatic layer, a fan speed of one or more fans of the AHU, or damper positions such as that of a bypass damper when no additional cooling of the air is needed after the pre-cooling chiller.

In some embodiments, additional or alternative water sources may be used. In some embodiments, the water source is the municipal water supply or a water storage tank. In some embodiments, the water source is a hydrogen fuel cell that produces electricity for the datacenter. A byproduct of the hydrogen fuel cell is water, which is directed to a first water storage tank. In some embodiments, the first water storage tank or a second water storage tank further receives water from a captured rainwater source. By recycling water from additional and/or alternative water sources, the datacenter can limit the consumption of water from the municipal water supply.

In at least some embodiments, a thermal management system including a modular adiabatic layer and an SCS controlling water flow to the modular adiabatic layer saves water relative to a conventional evaporative thermal management system. Some embodiments can selectively cool affected zones through the modular and selective application of water or other evaporative media to subregions of the modular adiabatic layer.

In some embodiments, the SCS is further in data communication with a water aware controller that provides actions, commands, or cooling setpoints to the SCS and/or allocator to cool the racks, rows, rooms, or the datacenter as a whole in a power and water efficient manner. In some embodiments, the SCS is in data communication with and/or controls SCS engine and/or an AHU, such as those described herein. The water aware controller provides actions, commands, or cooling setpoints based on objective functions received from a user, such as actions, commands, or cooling setpoints that balance thermal management demand with thermal management supply while limiting water consumption from external sources.

In some embodiments, the water aware controller communicates predictions and actions to the SCS to meet a cooling setpoint input by a user. In some embodiments, the water aware controller can store and/or predict setpoints based on historical setpoints or setpoint requests. The SCS implements the action(s) by controlling at least parameter of an AHU such as described herein. In some embodiments, the SCS changes one or more operating parameters of the AHU, and the SCS transmits datacenter state variables back to the water aware controller. In some embodiments, the datacenter state variables are received at the SCS by one or more of datacenter sensors, control services (such as the control services described herein), an allocator, or other sources in data communication with the SCS described herein.

In some embodiments, the datacenter state variables include energy consumption (KWh) of the datacenter or portions of the datacenter, power consumption (KW) of the datacenter or portions of the datacenter, water consumption (L) of the datacenter or portions of the datacenter, waste water status and rate (L) of the datacenter or portions of the datacenter, waste heat status and rate (Cal) of the datacenter or portions of the datacenter, IT load utilization (%) of the datacenter or portions of the datacenter, aisle temperature (C) of the datacenter or portions of the datacenter, aisle relative humidity (%) of the datacenter or portions of the datacenter, hardware failure rate per SKU of the datacenter or portions of the datacenter, out of specification server conditions of the datacenter or portions of the datacenter, alarm status of the datacenter or portions of the datacenter, Wet Bulb Global Temperature (WBGT) status of the datacenter or portions of the datacenter, heat block status of the datacenter or portions of the datacenter, cooling system status of the datacenter or portions of the datacenter, and other state variables that provide information as to the current operating conditions of and in the datacenter.

In some embodiments, the SCS further includes an SCS engine that calculates and/or determines operational setting and conditions for the AHU. As described herein, the SCS engine may make such determinations based at least partially on actions or setpoints provided to the SCS engine by the water aware controller.

In some embodiments, objective functions relate one or more inputs to control variables of the AHU or other portions of the datacenter. For example, the control variables include, but are not limited to, OA temperature, OA relative humidity, modular adiabatic layer state, quantity of available AHU, water pump speed, AHU fan speed, bypass damper position, etc. Based at least partially on the state variables with values measured by the sensors, the SCS engine may determine values for at least some of the control variables.

In some embodiments, the water aware controller predicts one or more conditions of datacenter operating conditions and demands based on received information and historical information. In some embodiments, the SCS provides state variables to the water aware controller. The water aware controller provides a selected action to the SCS.

In some embodiments, the water aware controller includes a climate engine, a predictor, an action engine, or combinations thereof. The climate engine receives one or more environmental inputs and determines an environmental prediction that is provided to a predictor. The predictor receives the state variables from the SCS and/or the environmental prediction from the climate engine to predict a datacenter state prediction. The datacenter state prediction is provided to the action engine, and the action engine selects a selected action, which is provided to the SCS. In some embodiments, the SCS controls at least one control variable of an AHU, such as described herein, based on the selected action. In some embodiments, the SCS is in data communication with a control service, such as an allocator, to adjust the power demands (and heat generation) of the server computers or other IT load. Additionally, in some embodiments, the control service communicates to the SCS the processing loads, processing allocations, power draws, schedules, and other operating metrics of the devices of the datacenter. For example, the SCS may be able to proactively adjust the thermal management of the datacenter in response to scheduled computational loads provided by the control service.

In some embodiments, the climate engine generates an environmental prediction based on a plurality of environmental inputs. For example, the environmental inputs include environmental state variables measured by environmental sensors. In some embodiments, environmental state variables include outdoor temperature (C), relative humidity (%), barometric pressure (Pa), etc.

The environmental sensors provide current environmental conditions outside the datacenter (i.e., at the source of OA). For example, when the OA temperature is high, additional cooling demand is needed to sufficiently cool the OA before introducing the conditioned air to the cold aisle of the datacenter. In another example, when the relative humidity of the OA is high, an AHU with an adiabatic layer will have a diminished capability to cool the OA before introducing the conditioned air to the cold aisle of the datacenter.

In some embodiments, the climate engine receives an environmental input including historical climate data. For example, the climate engine obtains historical climate data (such as from the networked services) to extrapolate the probability of changes to the current environmental conditions measured by the environmental sensor(s). In some embodiments, the climate engine further obtains local weather forecasts as an environmental input. In some examples, the climate engine receives the local weather forecast from a networked service. In some embodiments, the local weather forecast provides a forecast 24-96 hours in advance of the current environmental conditions.

In some embodiments, the climate engine obtains or creates a record of past environmental conditions measured by the environmental sensors. The record of past environmental conditions allows the climate engine to determine correlations between the measured values of the environmental conditions and the local weather forecast to create an adjustment or other correction to the local weather forecast for the local environmental conditions at the datacenter.

The climate engine, based on the environmental inputs, calculates a localized environmental prediction for the local environmental conditions at the datacenter. The local environmental conditions of the environmental prediction can include the outside temperature, outside relative humidity, outside dew point, and other environmental conditions of the OA used by the datacenter (and the AHUs thereof) to provide conditioned air to the cold aisles.

The predictor uses state variables provided by the SCS regarding the current and historical operating conditions of the datacenter to generate a prediction of the internal conditions and IT loads of the datacenter at a future time. In some embodiments, the datacenter state predictions include localized datacenter state predictions for racks, rows, rooms, or other regions of the datacenter.

In some embodiments, the datacenter state predictions include at least temperature values and humidity values for the air in the datacenter. In some embodiments, the datacenter state predictions are based at least partially on recorded values of datacenter sensors and/or AHU sensors that measure the air conditions in the datacenter.

In some embodiments, the datacenter state predictions include at least IT load and/or heat generation predictions for the datacenter and/or portions of the datacenter. In some embodiments, the datacenter state predictions are based at least partially on recorded or scheduled IT loads in the datacenter or portions of the datacenter. For example, the IT loads vary based on time of day, day of the week, day of the month, or time of year. The IT loads have a power consumption value associated therewith that determines the heat generated by the server computers and associated components (such as power supplies and network switches). The datacenter state predictions, therefore, determine a thermal management demand of the datacenter and/or portions of the datacenter.

In some embodiments, the predictor transmits the datacenter state prediction and the environmental prediction to the action engine. In some embodiments, the predictor transmits the datacenter state prediction to the action engine, and the climate engine transmits the environmental prediction to the action engine. In some embodiments, the datacenter state predictions include a thermal management demand at a future time, and the environmental predictions include a thermal management supply at a future time. In some embodiments, based at least partially on the thermal management demand predicted by the datacenter state predictions and the thermal management supply based on the environmental prediction, the action engine selects one or more selected actions and transmits the selected action(s) to the SCS for implementation.

In some embodiments, a selected action includes one or more cooling setpoints for the SCS. In some embodiments, the selected action includes sending instructions to a plurality of AHUs to preemptively manage the thermal management supply (e.g., cooling) to the predicted thermal management demand at different portions or locations in the datacenter. As described herein, different AHUs in the datacenter are associated with cooling different portions of the datacenter, and an AHU with a modular adiabatic layer according to the present disclosure allows granular delivery of conditioned air to various portions or locations in the datacenter. In some embodiments, the SCS receives the one or more cooling setpoints and instructs one or more AHUs, valves, fans, or other components of the HVAC system in the datacenter to change at least one operating parameter.

In some embodiments, a selected action includes one or more IT load setpoints for the SCS. In some embodiments, the action engine determines a predicted thermal management demand to exceed a predicted thermal management supply. For example, the predicted IT load of the datacenter or portions of the datacenter exceeds the cooling capacity of the datacenter HVAC system or the AHUs responsible for cooling a portion of the datacenter based on the environmental prediction. In such an embodiment, the action engine determines that the thermal management supply is unable to manage the heat generated by the predicted datacenter state, and the action engine transmits to the SCS instructions to limit and/or migrate at least a portion of the IT load. In some embodiments, the SCS communicates with a control service to throttle or power cap one or more server computers, to allocate or reallocate VMs, or migrate IT load from the server computers to reduce the predicted thermal management demand of the datacenter or portions of the datacenter.

In some embodiments, a method of thermal management using a machine learning model includes obtaining a datacenter digital twin. In some embodiments, obtaining a datacenter digital twin includes generating or accessing a white box model of the datacenter. In some embodiments, a white box model is or includes a detailed thermal and mechanical model of the datacenter associated with all active controller algorithms implemented for cooling of the datacenter. In some embodiments, the model calculates the state variables such as indoor temperature, energy, and water consumptions, and byproducts. For example, water consumption and usage is calculated based at least partially on a psychometric model, such as described in relation to FIG. 7.

In some embodiments, obtaining a datacenter digital twin includes generating or accessing a grey box model of the datacenter. In some embodiments, a grey box model is or includes using machine learning model training in combination with information from the SCS such as existing rules to enable and disable portions of the cooling system (e.g., AHUs or portions of AHUs) to improve the accuracy of the grey box model. In some embodiments, the grey box model includes modeling at least one thermodynamic process of the datacenter digital twin with a neural network, other machine learning model, or other control logic.

In some embodiments, obtaining a datacenter digital twin includes generating or accessing a black box model of the datacenter. In some embodiments, a black box model is based on machine learning such as neural network, reinforcement deep learning model, etc., (such as described herein) using the input variables such as historic environmental state variables (temperature, relative humidity) and datacenter state variables to determine relationships therebetween and output datacenter state variables.

In some embodiments, the method further includes training the machine learning model of the digital twin. In some embodiments, training the machine learning model of the digital twin includes providing at least one training dataset including historic datacenter state variables and correlated historic environmental state variables of the datacenter. In some embodiments, the historic environmental state variables include outdoor temperature (C), relative humidity (%), barometric pressure (Pa), etc., or combinations thereof. In some embodiments, the historic datacenter state variables include energy consumption (KWh) of the datacenter or portions of the datacenter, power consumption (KW) of the datacenter or portions of the datacenter, water consumption (L) of the datacenter or portions of the datacenter, waste water status and rate (L) of the datacenter or portions of the datacenter, waste heat status and rate (Cal) of the datacenter or portions of the datacenter, IT load utilization (%) of the datacenter or portions of the datacenter, aisle temperature (C) of the datacenter or portions of the datacenter, aisle relative humidity (%) of the datacenter or portions of the datacenter, hardware failure rate per SKU of the datacenter or portions of the datacenter, out of specification server conditions of the datacenter or portions of the datacenter, alarm status of the datacenter or portions of the datacenter, Wet Bulb Global Temperature (WBGT) status of the datacenter or portions of the datacenter, heat block status of the datacenter or portions of the datacenter, cooling system status of the datacenter or portions of the datacenter, and other state variables that provide information as to the operating conditions of and in the datacenter. In some embodiments, the datacenter state variables and environmental state variables are correlated by date and time.

In some embodiments, the machine learning model is a neural network model. In some embodiments, the machine learning model is a reinforcement learning model. In some embodiments, the machine learning model of the digital twin determines a plurality of relationships (correlative and/or causal) between the historic state variables.

In some embodiments, the method further includes predicting a datacenter state prediction. In some embodiments, predicting a datacenter state prediction includes providing to the digital twin (and the machine learning model thereof) real-time telemetry of the datacenter state variables and the environmental state variables. In some embodiments, predicting a datacenter state prediction includes providing to the digital twin (and the machine learning model thereof) an environmental prediction. In some embodiments, predicting a datacenter state prediction includes providing to the digital twin (and the machine learning model thereof) real-time telemetry of the datacenter state variables and the environmental state variables and an environmental prediction. Based at least partially on the plurality of relationships (correlative and/or causal) between the historic state variables, the real-time telemetry of the datacenter state variables, and the environmental prediction, the machine learning model determines the datacenter state prediction.

The method further includes, in some embodiments, selecting a selected action at the action engine based on the datacenter state prediction of the digital twin (and the machine learning model thereof).

In some embodiments, a selected action includes one or more cooling setpoints for the SCS. In some embodiments, the selected action includes sending instructions to a plurality of AHUs to preemptively manage the thermal management supply (e.g., cooling) to the predicted thermal management demand at different portions or locations in the datacenter. As described herein, different AHUs in the datacenter are associated with cooling different portions of the datacenter, and an AHU with a modular adiabatic layer according to the present disclosure allows granular delivery of conditioned air to various portions or locations in the datacenter. In some embodiments, the SCS receives the one or more cooling setpoints and instructs one or more AHUs, valves, fans, or other components of the HVAC system in the datacenter to change at least one operating parameter.

In some embodiments, a selected action includes one or more IT load setpoints for the SCS. In some embodiments, the action engine determines a predicted thermal management demand to exceed a predicted thermal management supply. For example, the predicted IT load of the datacenter or portions of the datacenter exceeds the cooling capacity of the datacenter HVAC system or the AHUs responsible for cooling a portion of the datacenter based on the environmental prediction. In such an embodiment, the action engine determines that the thermal management supply is unable to manage the heat generated by the predicted datacenter state, and the action engine transmits to the SCS instructions to limit and/or migrate at least a portion of the IT load. In some embodiments, the SCS communicates with a control service to throttle or power cap one or more server computers, to allocate or reallocate VMs, or migrate IT load from the server computers to reduce the predicted thermal management demand of the datacenter or portions of the datacenter.

In some embodiments, the neural network has a plurality of layers with an input layer configured to receive at least one input training dataset or input training instance and an output layer, with a plurality of additional or hidden layers therebetween. The training datasets can be input into the neural network to train the neural network and identify individual and combinations of labels or attributes of the training instances. In some embodiments, the neural network can receive multiple training datasets concurrently and learn from the different training datasets simultaneously. While the illustrated embodiment includes a limited quantity of nodes, it should be understood that, in some embodiments, a neural network has millions, billions, or more of nodes in the input layer, hidden layers, output layer, or combination thereof.

In some embodiments, a machine learning system includes a plurality of machine learning models that operate together. Each of the machine learning models has a plurality of hidden layers between the input layer and the output layer. The hidden layers have a plurality of input nodes (e.g., nodes), where each of the nodes operates on the received inputs from the previous layer. In a specific example, a first hidden layer has a plurality of nodes and each of the nodes performs an operation on each instance from the input layer. Each node of the first hidden layer provides a new input into each node of the second hidden layer, which, in turn, performs a new operation on each of those inputs. The nodes of the second hidden layer then passes outputs, such as identified clusters, to the output layer.

In some embodiments, each of the nodes has a linear function and an activation function. The linear function may attempt to optimize or approximate a solution with a line of best fit, such as reduced power cost or reduced latency. The activation function operates as a test to check the validity of the linear function. In some embodiments, the activation function produces a binary output that determines whether the output of the linear function is passed to the next layer of the machine learning model. In this way, the machine learning system can limit and/or prevent the propagation of poor fits to the data and/or non-convergent solutions.

The machine learning model includes an input layer that receives at least one training dataset. In some embodiments, at least one machine learning model uses supervised training. In some embodiments, at least one machine learning model uses unsupervised training. Unsupervised training can be used to draw inferences and find patterns or associations from the training dataset(s) without known outputs. In some embodiments, unsupervised learning can identify clusters of similar labels or characteristics for a variety of training instances and allow the machine learning system to extrapolate the performance of instances with similar characteristics.

In some embodiments, semi-supervised learning can combine benefits from supervised learning and unsupervised learning. As described herein, the machine learning system can identify associated labels or characteristics between instances, which may allow a training dataset with known outputs and a second training dataset including more general input information to be fused. Unsupervised training can allow the machine learning system to cluster the instances from the second training dataset without known outputs and associate the clusters with known outputs from the first training dataset. The values of the output layer, in some embodiments, are compared to known values of training instances, and parameters associated with each node of the hidden layer(s) allow back propagation through the neural network to refine and train the neural network.

The present disclosure relates to systems and methods for cooling electronic components and/or devices according to at least the examples provided in the clauses below:

Clause 1. A thermal management system comprising: a datacenter supervisory control system (SCS); at least one datacenter sensor in data communication with the SCS to communicate a datacenter state variable to the SCS; at least one environmental sensor in data communication with the SCS to communicate an environmental state variable to the SCS; and a water aware controller in data communication with the SCS, wherein the water aware controller includes a predictor that receives a datacenter state input based on the datacenter state variable, the environmental state input based on the environmental state variable, and at least one user objective function, and the water aware controller transmits a selected action to the SCS to meet a setpoint based on the datacenter state input and the environmental state input.

Clause 2. The thermal management system of clause 1, wherein the SCS is in data communication with an air handling unit (AHU) that is configured to receive outside air (OA) from an OA intake, and water from a water source, and the AHU is configured to direct conditioned air toward a cold aisle based at least partially on the selected action.

Clause 3. The thermal management system of clause 2, wherein the AHU includes a modular adiabatic layer containing an evaporative media, and the modular adiabatic layer includes a plurality of subregions configured to be wetted by the evaporative media separately of one another based at least partially on the selected action.

Clause 4. The thermal management system of clause 3, wherein the SCS controls at least one operating condition of the AHU including at least one of water pump speed, fan speed, and a wetted subregion of the modular adiabatic layer.

Clause 5. The thermal management system of clause 2, wherein the water source is a fuel cell.

Clause 6. The thermal management system of any preceding clause, wherein the environmental sensor includes at least one of an environmental temperature sensor, a humidity sensor, a water source temperature sensor; and a barometer.

Clause 7. The thermal management system of any preceding clause, wherein the datacenter sensor includes at least one of a component temperature sensor, a component humidity sensor, a datacenter temperature sensor, a datacenter humidity sensor, and a processing load sensor.

Clause 8. The thermal management system of any preceding clause, wherein the SCS is in data communication with an allocator configured to change an IT load of a portion of the datacenter based at least partially on the selected action.

Clause 9. The thermal management system of any preceding clause, wherein the water aware controller further includes a climate engine that receives the environmental state variable and produces the environmental state input to the predictor.

Clause 10. The thermal management system of any preceding clause, wherein the water aware controller further includes an action engine that receives the selected action from the predictor and provides one or more system control commands to the SCS.

Clause 11. A method of thermal management in a datacenter, the method comprising: obtaining a datacenter digital twin; training a machine learning model of the digital twin; predicting a datacenter state prediction using the machine learning model; and selecting a selected action at an action engine based on the datacenter state prediction.

Clause 12. The method of clause 11, wherein the datacenter digital twin is a grey box model of the datacenter.

Clause 13. The method of clause 11 or 12, wherein the machine learning model of the datacenter digital twin is a neural network.

Clause 14. The method of any of clauses 11-13, wherein training the machine learning model of the datacenter digital twin includes providing at least one training dataset including historic datacenter state variables and correlated historic environmental state variables of the datacenter.

Clause 15. The method of any of clauses 11-14, wherein predicting the datacenter state prediction includes providing real-time telemetry of datacenter state variables and environmental state variables to the digital twin.

Clause 16. The method of clause 15, wherein predicting the datacenter state prediction further includes providing to the digital twin an environmental prediction from a climate engine.

Clause 17. The method of any of clauses 11-16, wherein the selected action includes sending instructions to a plurality of AHUs to manage a thermal management supply based on the datacenter state prediction.

Clause 18. The method of any of clauses 11-17, wherein the selected action includes one or more IT load setpoints.

Clause 19. A thermal management system comprising: a datacenter supervisory control system (SCS); at least one datacenter sensor in data communication with the SCS to communicate a datacenter state variable to the SCS; at least one environmental sensor in data communication with the SCS to communicate an environmental state variable to the SCS; and a water aware controller in data communication with the SCS, wherein the water aware controller includes: a climate engine configured to determine an environmental prediction, a predictor configured to determine a datacenter state prediction, and an action engine configured to select a selected action based on the environmental prediction, the datacenter state prediction, and at least one objective function.

Clause 20. The thermal management system of clause 19, wherein the at least one objective function includes minimizing water consumption.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system comprising:
a datacenter supervisory control system (SCS);
at least one datacenter sensor in data communication with the SCS to communicate a datacenter state variable to the SCS;

at least one environmental sensor in data communication with the SCS to communicate an environmental state variable to the SCS; and an air handling unit (AHU) including a modular adiabatic layer;

a plurality of cold aisles, wherein a first cold aisle of the plurality of cold aisles is configured to receive first conditioned air from a first subregion of the modular adiabatic layer and a second cold aisle of the plurality of cold aisles is configured to receive second conditioned air from a second subregion of the modular adiabatic layer;

a water aware controller in data communication with the SCS, wherein the water aware controller includes a predictor that receives a datacenter state input based on the datacenter state variable, the environmental state input based on the environmental state variable, and at least one user objective function, and the water aware controller transmits a selected action to the SCS to meet a setpoint based on the datacenter state input and the environmental state input, and wherein the AHU is in data communication with the SCS and the AHU is configured to direct the first conditioned air from the first subregion toward the first cold aisle based at least partially on the selected action.

2. The thermal management system of claim 1, wherein the SCS is in data communication with an air handling unit (AHU) that is configured to receive outside air (OA) from an OA intake, and water from a water source.

3. The thermal management system of claim 2, wherein the water source is a fuel cell.

4. The thermal management system of claim 1, wherein the SCS controls at least one operating condition of the AHU including at least one of water pump speed, fan speed, and a wetted subregion of the modular adiabatic layer.

5. The thermal management system of claim 1, wherein the environmental sensor includes at least one of an environmental temperature sensor, a humidity sensor, a water source temperature sensor; and a barometer.

6. The thermal management system of claim 1, wherein the datacenter sensor includes at least one of a component temperature sensor, a component humidity sensor, a datacenter temperature sensor, a datacenter humidity sensor, and a processing load sensor.

7. The thermal management system of claim 1, wherein the SCS is in data communication with an allocator configured to change an IT load of a portion of the datacenter based at least partially on the selected action.

8. The thermal management system of claim 1, wherein the water aware controller further includes a climate engine that receives the environmental state variable and produces the environmental state input to the predictor.

9. The thermal management system of claim 1, wherein the water aware controller further includes an action engine that receives the selected action from the predictor and provides one or more system control commands to the SCS.

10. A method of thermal management in a datacenter, the method comprising:

obtaining a datacenter digital twin;

training a machine learning model of the digital twin;

predicting a datacenter state prediction using the machine learning model; and selecting a selected action at an action engine based on the datacenter state prediction, wherein the selected action includes:

selectively wetting a first subregion of a modular adiabatic layer and a second subregion of the modular adiabatic layer, directing first conditioned air from the first subregion of the modular adiabatic layer to a first cold aisle, and directing second conditioned air from the second subregion of the modular adiabatic layer to a second cold aisle.

11. The method of claim 10, wherein the datacenter digital twin is a grey box model of the datacenter.

12. The method of claim 10, wherein the machine learning model of the datacenter digital twin is a neural network.

13. The method of claim 10, wherein training the machine learning model of the datacenter digital twin includes providing at least one training dataset including historic datacenter state variables and correlated historic environmental state variables of the datacenter.

14. The method of claim 10, wherein predicting the datacenter state prediction includes providing real-time telemetry of datacenter state variables and environmental state variables to the digital twin.

15. The method of claim 14, wherein predicting the datacenter state prediction further includes providing to the digital twin an environmental prediction from a climate engine.

16. The method of claim 10, wherein the selected action includes sending instructions to a plurality of AHUs to manage a thermal management supply based on the datacenter state prediction.

17. The method of claim 10, wherein the selected action includes one or more IT load setpoints.

18. The method of claim 10, further comprising directing third conditioned air from a third subregion of the modular adiabatic layer to a third cold aisle, wherein the third subregion is not wetted.

19. A thermal management system comprising:

a datacenter supervisory control system (SCS);

at least one datacenter sensor in data communication with the SCS to communicate a datacenter state variable to the SCS;

at least one environmental sensor in data communication with the SCS to communicate an environmental state variable to the SCS; and an air handling unit (AHU) including a modular adiabatic layer;

a plurality of cold aisles, wherein a first cold aisle of the plurality of cold aisles is configured to receive first conditioned air from a first subregion of the modular adiabatic layer and a second cold aisle of the plurality of cold aisles is configured to receive second conditioned air from a second subregion of the modular adiabatic layer;

a water aware controller in data communication with the SCS, wherein the water aware controller includes:

a climate engine configured to determine an environmental prediction, a predictor configured to determine a datacenter state prediction, and an action engine configured to select a selected action based on the environmental prediction, the datacenter state prediction, and at least one objective function, wherein the AHU is in data communication with the SCS and the AHU is configured to direct the first conditioned air from the first subregion toward the first cold aisle based at least partially on the selected action.

20. The thermal management system of claim 19, wherein the at least one objective function includes minimizing water consumption.

* * * * *